(12) United States Patent
Inaoka et al.

(10) Patent No.: US 11,622,086 B2
(45) Date of Patent: Apr. 4, 2023

(54) SOLID-STATE IMAGE SENSOR, IMAGING DEVICE, AND METHOD OF CONTROLLING SOLID-STATE IMAGE SENSOR

(71) Applicant: Sony Semiconductor Solutions Corporation, Kanagawa (JP)

(72) Inventors: Yutaka Inaoka, Kanagawa (JP); Hongbo Zhu, Tokyo (JP); Takafumi Takatsuka, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 77 days.

(21) Appl. No.: 16/964,666

(22) PCT Filed: Dec. 4, 2018

(86) PCT No.: PCT/JP2018/044462
§ 371 (c)(1),
(2) Date: Aug. 7, 2020

(87) PCT Pub. No.: WO2019/150752
PCT Pub. Date: Aug. 8, 2019

(65) Prior Publication Data
US 2020/0382726 A1    Dec. 3, 2020

(30) Foreign Application Priority Data

Feb. 2, 2018 (JP) .............................. JP2018-017019
Feb. 2, 2018 (JP) .............................. JP2018-017020

(51) Int. Cl.
*H04N 5/351* (2011.01)
*H01L 27/146* (2006.01)

(52) U.S. Cl.
CPC ....... *H04N 5/351* (2013.01); *H01L 27/14627* (2013.01); *H01L 27/14643* (2013.01)

(58) Field of Classification Search
CPC .... H04N 5/351; H04N 5/3745; H04N 5/2351; H04N 5/3559; H04N 5/3694; H01L 27/14627; H01L 27/14643; H01L 27/146
See application file for complete search history.

(56) References Cited

U.S. PATENT DOCUMENTS 10,903,386 B2 * 1/2021 Haraguchi ........ H01L 27/14643
2010/0019343 A1   1/2010 Ellis et al.
(Continued)

FOREIGN PATENT DOCUMENTS

JP    2000-253320 A    9/2000
JP    2007-005774 A    1/2007
(Continued)

*Primary Examiner* — Shahbaz Nazrul
(74) *Attorney, Agent, or Firm* — Michael Best & Friedrich LLP

(57) ABSTRACT

To reduce power consumption in a solid-state image sensor that detects weak light.
The solid-state image sensor includes a photodiode, a resistor, a measuring unit, and a control unit. The photodiode photoelectrically converts incident light and outputs a photocurrent. The resistor drops a potential of one end of the photodiode to a value lower than a power supply potential every time a photocurrent is output. The measuring unit measures illuminance of the incident light on the basis of a frequency of dropping of the potential of one end. The control unit controls the power supply potential to a lower value as the measured illuminance is higher.

16 Claims, 35 Drawing Sheets

(56) References Cited

U.S. PATENT DOCUMENTS

| | | |
|---|---|---|
| 2011/0249162 A1 | 10/2011 | Moore |
| 2012/0057059 A1 | 3/2012 | Eldesouki et al. |
| 2015/0163429 A1* | 6/2015 | Dai .................. H04N 5/3535 |
| | | 348/295 |
| 2017/0131143 A1* | 5/2017 | Andreou ......... H01L 31/035272 |
| 2020/0252534 A1* | 8/2020 | Yasuda ................ H04N 5/2353 |
| 2020/0358972 A1* | 11/2020 | Suzuki ............... H04N 5/35527 |

FOREIGN PATENT DOCUMENTS

| | | |
|---|---|---|
| JP | 2009-124513 A | 6/2009 |
| JP | 2010-199953 A | 9/2010 |
| JP | 2013-257423 A | 6/2012 |
| JP | 2016-156748 A | 9/2016 |
| JP | 2017-521682 A | 8/2017 |
| JP | 2018-013422 A | 9/2018 |
| WO | 2013/157448 A1 | 10/2013 |

* cited by examiner

*FIG. 8*

| COUNT VALUE CNT | SWITCHING SIGNAL SW |
|---|---|
| CNT≤Th1 (ILLUMINANCE LOW) | SW=0 (SELECT HIGH POTENTIAL VE1) |
| CNT>Th1 (ILLUMINANCE HIGH) | SW=1 (SELECT LOW POTENTIAL VE2) |

FIG. 9

| 5V (ILLUMINANCE LOW) | 5V (ILLUMINANCE LOW) | 1V (ILLUMINANCE HIGH) | ... |
|---|---|---|---|
| 1V (ILLUMINANCE HIGH) | 5V (ILLUMINANCE LOW) | 5V (ILLUMINANCE LOW) | |
| 5V (ILLUMINANCE LOW) | 5V (ILLUMINANCE LOW) | 1V (ILLUMINANCE HIGH) | |

⋮ a

| 5V | 5V | 5V | ... |
|---|---|---|---|
| 5V | 5V | 5V | |
| 5V | 5V | 5V | |

| COUNT VALUE CNT | SWITCHING SIGNAL SW |
|---|---|
| CNT≤Th1<br>(ILLUMINANCE LOW) | SW=0<br>(SELECT HIGH POTENTIAL VE1) |
| Th2≥CNT>Th1<br>(ILLUMINANCE INTERMEDIATE) | SW=1<br>(SELECT INTERMEDIATE POTENTIAL VE2) |
| CNT>Th2<br>(ILLUMINANCE HIGH) | SW=2<br>(SELECT LOW POTENTIAL VE3) |

*FIG. 16*

| EXPOSURE CONTROL SIGNAL | DETERMINATION RESULT | OPERATION OF PHOTON COUNTER |
|---|---|---|
| 0 (OUTSIDE EXPOSURE PERIOD) | DEC=0 (CNT<L1) | COUNT STOP |
| 0 (OUTSIDE EXPOSURE PERIOD) | DEC=1 (CNT=L1) | COUNT STOP |
| 1 (WITHIN EXPOSURE PERIOD) | DEC=0 (CNT<L1) | COUNT OPERATION |
| 1 (WITHIN EXPOSURE PERIOD) | DEC=1 (CNT=L1) | COUNT STOP |

FIG. 17

| COUNT VALUE CNT | DETERMINATION RESULT |
|---|---|
| CNT<L1 | DEC=0 (COUNT OPERATION) |
| CNT=L1 | DEC=1 (COUNT STOP) |

*FIG. 18*

| DETERMINATION RESULT | OPERATION OF ESTIMATION UNIT |
|---|---|
| DEC=0 (COUNT OPERATION) | — (CALCULATION STOP) |
| DEC=1 (COUNT STOP) | EST=L1×(Te/Tc) |

FIG. 25

| OUTPUT VALUE OUT | SWITCHING SIGNAL SW |
|---|---|
| OUT≤Th1<br>(ILLUMINANCE LOW) | SW=0<br>(SELECT HIGH POTENTIAL VE1) |
| OUT>Th1<br>(ILLUMINANCE HIGH) | SW=1<br>(SELECT LOW POTENTIAL VE2) |

FIG. 26

| SWITCHING SIGNAL SW | COUNT VALUE CNT | DETERMINATION RESULT |
|---|---|---|
| SW=0 (SELECT HIGH POTENTIAL VE1) | CNT<L1 | DEC=0 |
| | CNT=L1 | DEC=1 |
| SW=1 (SELECT LOW POTENTIAL VE2) | CNT<L2 | DEC=0 |
| | CNT=L2 | DEC=1 |

FIG. 27

| DETERMINATION RESULT | SWITCHING SIGNAL SW | OPERATION OF ESTIMATION UNIT |
|---|---|---|
| DEC=0 (COUNT OPERATION) | SW=0 (SELECT HIGH POTENTIAL VE1) | — (CALCULATION STOP) |
| | SW=1 (SELECT LOW POTENTIAL VE2) | |
| DEC=1 (COUNT STOP) | SW=0 (SELECT HIGH POTENTIAL VE1) | EST=L1×(Te/Tc) |
| | SW=1 (SELECT LOW POTENTIAL VE2) | EST=L2×(Te/Tc) |

FIG. 28

|  |  |  |  |
|---|---|---|---|
| 5V (ILLUMINANCE LOW) | 5V (ILLUMINANCE LOW) | 1V (ILLUMINANCE HIGH) | ... |
| 1V (ILLUMINANCE HIGH) | 5V (ILLUMINANCE LOW) | 5V (ILLUMINANCE LOW) |  |
| 5V (ILLUMINANCE LOW) | 5V (ILLUMINANCE LOW) | 1V (ILLUMINANCE HIGH) |  |

⋮ a

| | | | |
|---|---|---|---|
| 5V | 5V | 5V | ... |
| 5V | 5V | 5V | |
| 5V | 5V | 5V | |

| COUNT VALUE CNT | SWITCHING SIGNAL SW |
|---|---|
| $CNT \leq Th1$ (ILLUMINANCE LOW) | $SW=0$ (SELECT HIGH POTENTIAL VE1) |
| $Th2 \geq CNT > Th1$ (ILLUMINANCE INTERMEDIATE) | $SW=1$ (SELECT INTERMEDIATE POTENTIAL VE2) |
| $CNT > Th2$ (ILLUMINANCE HIGH) | $SW=2$ (SELECT LOW POTENTIAL VE3) |

FIG. 32

| SWITCHING SIGNAL SW | COUNT VALUE CNT | DETERMINATION RESULT |
|---|---|---|
| SW=0 (SELECT HIGH POTENTIAL VE1) | CNT<L1 | DEC=0 |
| | CNT=L1 | DEC=1 |
| SW=1 (SELECT INTERMEDIATE POTENTIAL VE2) | CNT<L2 | DEC=0 |
| | CNT=L2 | DEC=1 |
| SW=2 (SELECT LOW POTENTIAL VE3) | CNT<L3 | DEC=0 |
| | CNT=L3 | DEC=1 |

*FIG. 33*

| DETERMINATION RESULT | SWITCHING SIGNAL SW | OPERATION OF ESTIMATION UNIT |
|---|---|---|
| DEC=0 (COUNT OPERATION) | SW=0 (SELECT HIGH POTENTIAL VE1) | — (CALCULATION STOP) |
| | SW=1 (SELECT INTERMEDIATE POTENTIAL VE2) | |
| | SW=2 (SELECT LOW POTENTIAL VE3) | |
| DEC=1 (COUNT STOP) | SW=0 (SELECT HIGH POTENTIAL VE1) | $EST = L1 \times (Te/Tc)$ |
| | SW=1 (SELECT INTERMEDIATE POTENTIAL VE2) | $EST = L2 \times (Te/Tc)$ |
| | SW=2 (SELECT LOW POTENTIAL VE3) | $EST = L3 \times (Te/Tc)$ |

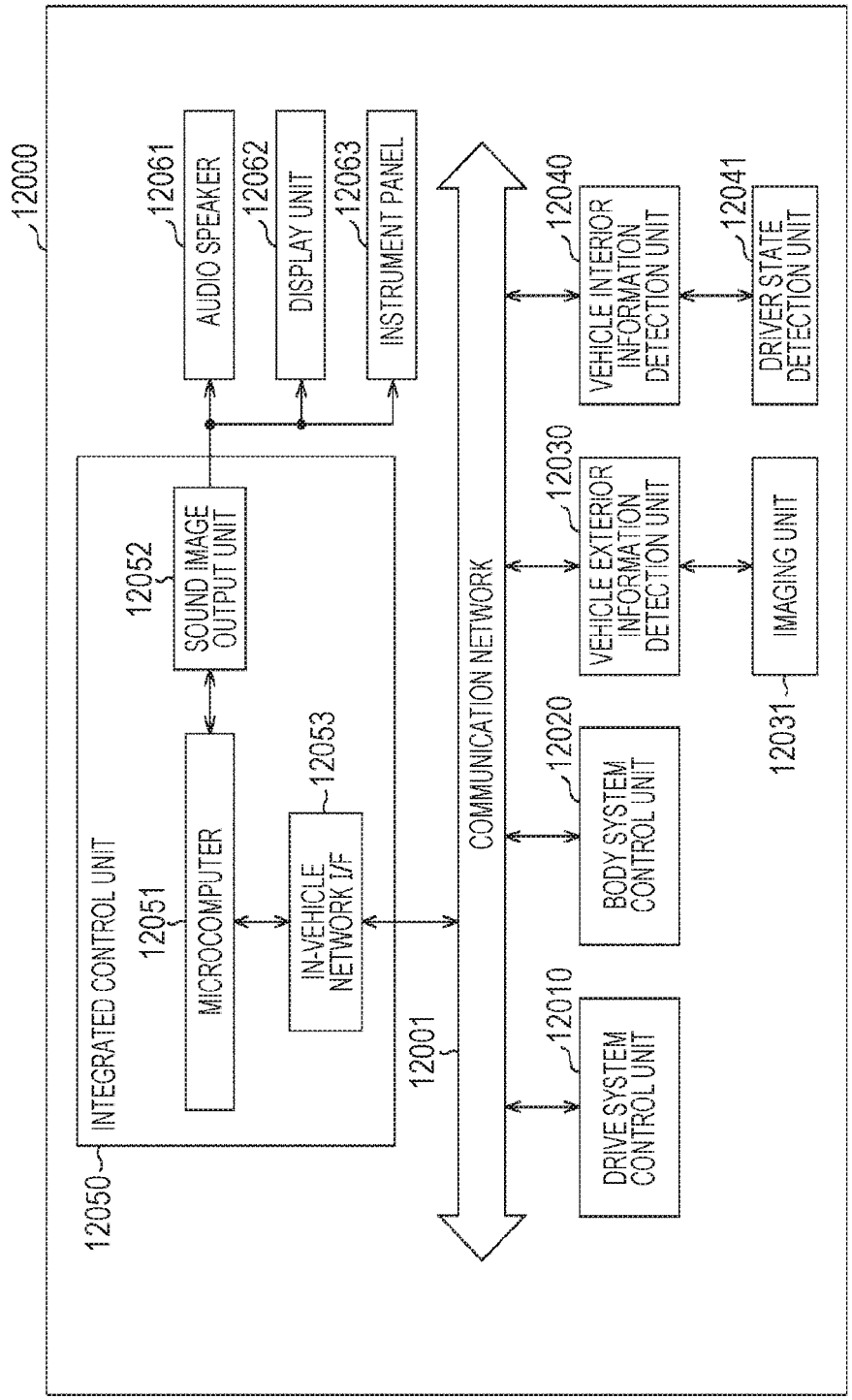

SOLID-STATE IMAGE SENSOR, IMAGING DEVICE, AND METHOD OF CONTROLLING SOLID-STATE IMAGE SENSOR

TECHNICAL FIELD

The present technology relates to a solid-state image sensor, an imaging device, and a method of controlling a solid-state image sensor. More specifically, the present technology relates to a solid-state image sensor for imaging image data, an imaging device, and a method of controlling a solid-state image sensor.

BACKGROUND ART

Conventionally, in an imaging device or the like, a semiconductor device having a plurality of pixels arranged to image image data has been used. For example, a semiconductor device provided with a photodiode such as an avalanche photodiode for amplifying a photocurrent and a complementary MOS (CMOS) for each pixel has been proposed (for example, see Patent Document 1). In this semiconductor device, a power supply potential is controlled to the same value for all of pixels.

CITATION LIST

Patent Document

Patent Document 1: US 2010/0019343 A

SUMMARY OF THE INVENTION

Problems to be Solved by the Invention

In the above-described conventional technology, since the photocurrent is amplified by the avalanche photodiode, weak light can be detected. However, reduction of the power consumption is difficult by the conventional technology. For example, the power consumption can be reduced by decreasing the power supply potential but sensitivity of all the pixels is decreased due to the decrease in the power supply potential, and especially, brightness may become insufficient in a pixel on which light with low illuminance is incident.

The present technology has been made in view of such a situation and has as an object to reduce power consumption in a solid-state image sensor that detects weak light.

Solutions to Problems

The present technology has been made to solve the above-described problems, and a first aspect of the present technology is a solid-state image sensor and a method of controlling the solid-state image sensor, the solid-state image sensor including a photodiode configured to photoelectrically convert the incident light and output a photocurrent, a resistor configured to drop a potential of one end of the photodiode to a value lower than a power supply potential every time the photocurrent is output, a measuring unit configured to measure illuminance of the incident light on the basis of a frequency of dropping of the potential of the one end, and a power supply control unit configured to control the power supply potential to a lower value as the measured illuminance is higher. This brings about an effect that the power supply potential is controlled to a lower value as the illuminance is higher.

Furthermore, in the first aspect, the power supply control unit may control the power supply potential on the basis of a comparison result between the illuminance and a predetermined threshold. This brings about an effect that the power supply potential is controlled to one of two potentials.

Furthermore, in the first aspect, the power supply control unit may control the power supply potential on the basis of comparison results between the illuminance and a plurality of thresholds different from one another. This brings about an effect that the power supply potential is controlled to one of three potentials.

Furthermore, in the first aspect, the photodiode, the resistor, the measuring unit, and the power supply control unit may be arranged in each of a plurality of pixel circuits arrayed in a two-dimensional lattice manner. This brings about an effect that the power supply potential is controlled for each pixel circuit.

Furthermore, in the first aspect, the measuring unit may count a number of times the potential of one end has been dropped within a predetermined exposure period and supply a count value to the power supply control unit as a measurement value of the illuminance. This brings about an effect that the power supply potential is controlled according to the number of times the potential of one end has been dropped within the exposure period.

Furthermore, in the first aspect, a selection unit configured to select one of a plurality of potentials different from one another according to a switching signal and supply the selected potential as the power supply potential may be further included, and the power supply control unit may supply the switching signal to the selection unit. This brings about an effect that the power supply potential is controlled to any one of the plurality of potentials.

Furthermore, a second aspect of the present technology is a solid-state image sensor including an imaging lens configured to collect incident light, a photodiode configured to photoelectrically convert the incident light and output a photocurrent, a resistor configured to drop a potential of one end of the photodiode to a value lower than a power supply potential every time the photocurrent is output, a measuring unit configured to measure illuminance of the incident light on the basis of a frequency of dropping of the potential of the one end, and a power supply control unit configured to control the power supply potential to a lower value as the measured illuminance is higher. This brings about an effect that the power supply potential is controlled to a lower value as the illuminance of the incident light from the imaging lens is higher.

Furthermore, a third aspect of the present technology is a solid-state image sensor and a method of controlling the solid-state image sensor, the solid-state image sensor including a count unit configured to count a number of times a photon has been incident within a predetermined exposure period and output a count value, a count control unit configured to stop the count unit in a case where the count value has reached a predetermined limit value before the predetermined exposure period elapses, and an estimation unit configured to estimate a number of incident times of a photon within the predetermined exposure period on the basis of a time to stop the count unit and output the estimated number of incident times as an estimation value. This brings about the effect that the count unit is stopped in the case where the count value has reached the predetermined limit value, and the estimation value is output.

Furthermore, in the third aspect, the estimation unit may obtain the estimation value from the time to stop the count unit, a length of the predetermined exposure period, and the predetermined limit value. This brings about an effect that the estimation value obtained from the time to reach a predetermined limit value, the length of the predetermined exposure period, and the predetermined limit value is output.

Furthermore, in the third aspect, a photodiode configured to detect presence or absence of incidence of one photon, a resistor configured to return a potential of one end of the photodiode to an initial state every time the incidence of one photon is detected, a switch configured to output the estimation value as an output value in a case where the count value has reached the predetermined limit value and output the count value as the output value in a case where the count value has not reached the predetermined limit value, and a power supply control unit configured to control the power supply potential according to the output value can be further included, and the count unit can count a number of times the potential of one end has varied due to the detection of the presence or absence of incidence of one photon, and the count control unit and the estimation unit can control the predetermined limit value according to the power supply potential. This brings about an effect that the count unit is stopped in the case where the count value has reached the limit value controlled according to the power supply potential.

Furthermore, in the third aspect, the power supply control unit may control the power supply potential on the basis of a comparison result between the output value and a predetermined threshold. This brings about an effect that the power supply potential is controlled to one of two potentials.

Furthermore, in the third aspect, the power supply control unit may control the power supply potential on the basis of comparison results between the output value and a plurality of thresholds different from one another. This brings about an effect that the power supply potential is controlled to one of three or more potentials.

Furthermore, in the third aspect, the photodiode and the resistor may be arranged on a light receiving chip, and the count unit, the count control unit, the estimation unit, the switch, and the power supply control unit may be arranged on a logic chip stacked on the light receiving chip. This brings about an effect that a potential drop occurs due to the resistor in the light receiving chip.

Furthermore, in the third aspect, the photodiode may be arranged on a light receiving chip, and the resistor, the count unit, the count control unit, the estimation unit, the switch, and the power supply control unit may be arranged on a logic chip stacked on the light receiving chip. This brings about an effect that a potential drop occurs due to the resistor in the logic chip.

Furthermore, in the third aspect, the count unit and the count control unit may be arranged in each of a plurality of pixel circuits arrayed in a two-dimensional lattice manner. This brings about an effect that the estimation value is output for each pixel circuit.

Furthermore, a fourth aspect of the present technology is an imaging device including a count unit configured to count a number of times a photon has been incident within a predetermined exposure period and output a count value, a count control unit configured to stop the count unit in a case where the count value has reached a predetermined limit value before the predetermined exposure period elapses, an estimation unit configured to estimate a number of incident times of a photon within the predetermined exposure period on the basis of a time to stop the count unit and output the estimated number of incident times as an estimation value, and a recording unit configured to record image data generated from the estimation value. This brings about an effect that the count unit is stopped in the case where the count value has reached the predetermined limit value, and the image data generated from the estimation value is recorded.

Effects of the Invention

According to the present technology, in a solid-state image sensor that detects weak light, an excellent effect of reducing power consumption can be exerted. Note that the effects described here are not necessarily limited, and any of effects described in the present disclosure may be exhibited.

BRIEF DESCRIPTION OF DRAWINGS

FIG. 8 is a diagram illustrating an example of an operation of a power supply control unit according to the first embodiment of the present technology.

FIG. 9 is a diagram illustrating an example of a power supply potential for each pixel in each of the first embodiment of the present technology and a comparative example.

FIG. 12 is a diagram illustrating an example of an operation of a power supply control unit according to a modification of the first embodiment of the present technology.

FIG. 16 is a diagram illustrating an example of an operation of a photon counter according to the second embodiment of the present technology.

FIG. 17 is a diagram illustrating an example of an operation of a count control unit according to the second embodiment of the present technology.

FIG. 18 is a diagram illustrating an example of an operation of a signal processing unit according to the second embodiment of the present technology.

FIG. 25 is a diagram illustrating an example of an operation of a power supply control unit according to the third embodiment of the present technology.

FIG. 26 is a diagram illustrating an example of an operation of a count control unit according to the third embodiment of the present technology.

FIG. 27 is a diagram illustrating an example of an operation of a signal processing unit according to the third embodiment of the present technology.

FIG. 28 is a diagram illustrating an example of a power supply potential for each pixel in each of the third and second embodiments of the present technology.

FIG. 31 is a diagram illustrating an example of an operation of a power supply control unit according to the modification of the third embodiment of the present technology.

FIG. 32 is a diagram illustrating an example of an operation of a count control unit according to a modification of the third embodiment of the present technology.

FIG. 33 is a diagram illustrating an example of an operation of a signal processing unit according to a modification of the third embodiment of the present technology.

FIG. 34 is a block diagram illustrating a schematic configuration example of a vehicle control system.

MODE FOR CARRYING OUT THE INVENTION

Figure 1:
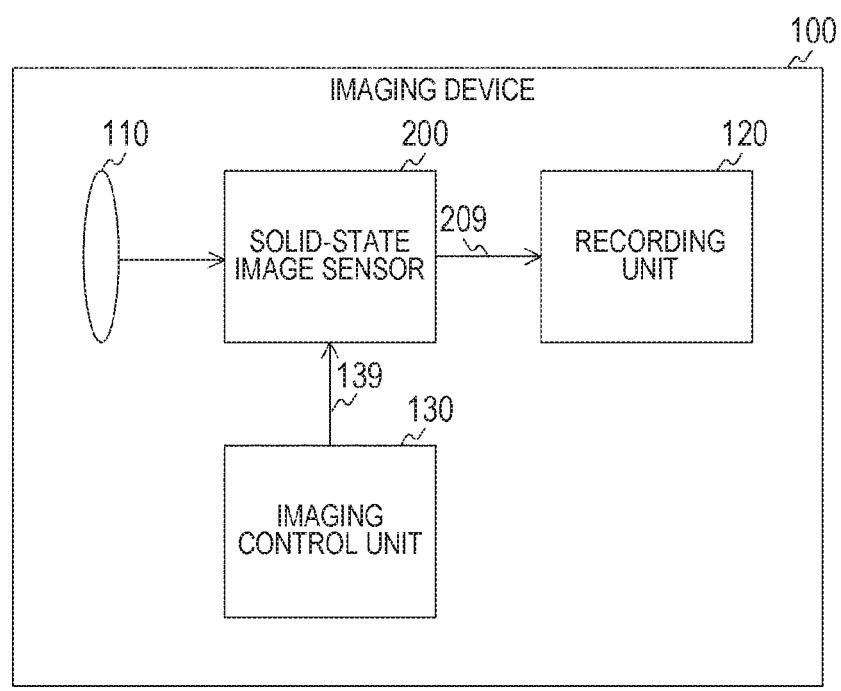
FIG. 1 is a block diagram illustrating a configuration example of an imaging device according to a first embodiment of the present technology.

Hereinafter, modes for implementing the present technology (hereinafter referred to as embodiments) will be described. Description will be given according to the following order.
1. First embodiment (an example of controlling a power supply potential in two stages according to illuminance)
2. Second embodiment (an example of stopping count when a count value reaches an upper limit value)
3. Third embodiment (an example of controlling a power supply potential and stopping count when a count value reaches an upper limit value)
4. Application examples to moving bodies 1. First Embodiment Configuration Example of Imaging Device FIG. 1 is a block diagram illustrating a configuration example of an imaging device 100 according to a first embodiment of the present technology. The imaging device 100 images image data, and includes an imaging lens 110, a solid-state image sensor 200, a recording unit 120, and an imaging control unit 130. As the imaging device 100, for example, a smartphone, a digital camera, a personal computer, a vehicle-mounted camera, or an internet of things (IoT) camera is assumed.

The imaging lens 110 condenses incident light and guides the incident light to the solid-state image sensor 200. The solid-state image sensor 200 images image data under the control of the imaging control unit 130. The solid-state image sensor 200 supplies the imaged image data to the recording unit 120 via a signal line 209. The recording unit 120 records the image data.

The imaging control unit 130 causes the solid-state image sensor 200 to image image data. The imaging control unit 130 supplies, for example, a synchronization signal such as a vertical synchronization signal and an exposure control signal for controlling an exposure period to the solid-state image sensor 200 via a signal line 139.

Note that the imaging device 100 may further include an interface and transmit image data to the outside through the interface, or may further include a display unit and display the image data on the display unit.

Configuration Example of Solid-State Image Sensor

Figure 2:
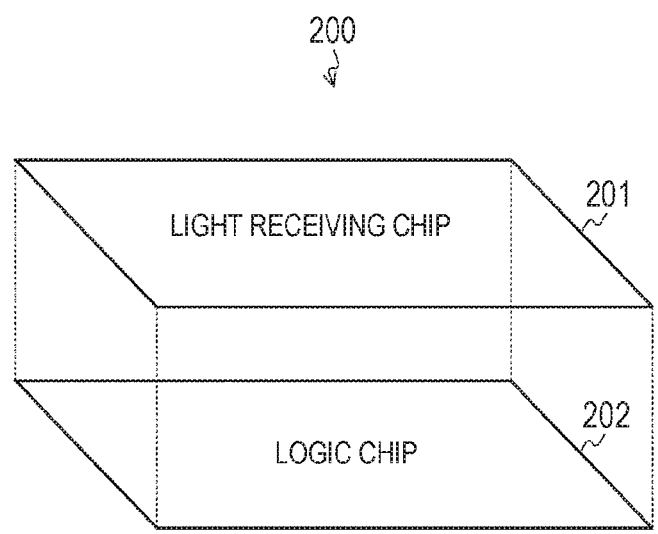
FIG. 2 is a diagram illustrating an example of a stacked structure of a solid-state image sensor according to the first embodiment of the present technology.

FIG. 2 is a diagram illustrating an example of a stacked structure of the solid-state image sensor 200 according to the first embodiment of the present technology. The solid-state image sensor 200 includes a light receiving chip 201 and a logic chip 202 stacked on the light receiving chip 201. A signal line for transmitting a signal is provided between these chips.

Configuration Example of Light Receiving Chip

Figure 3:
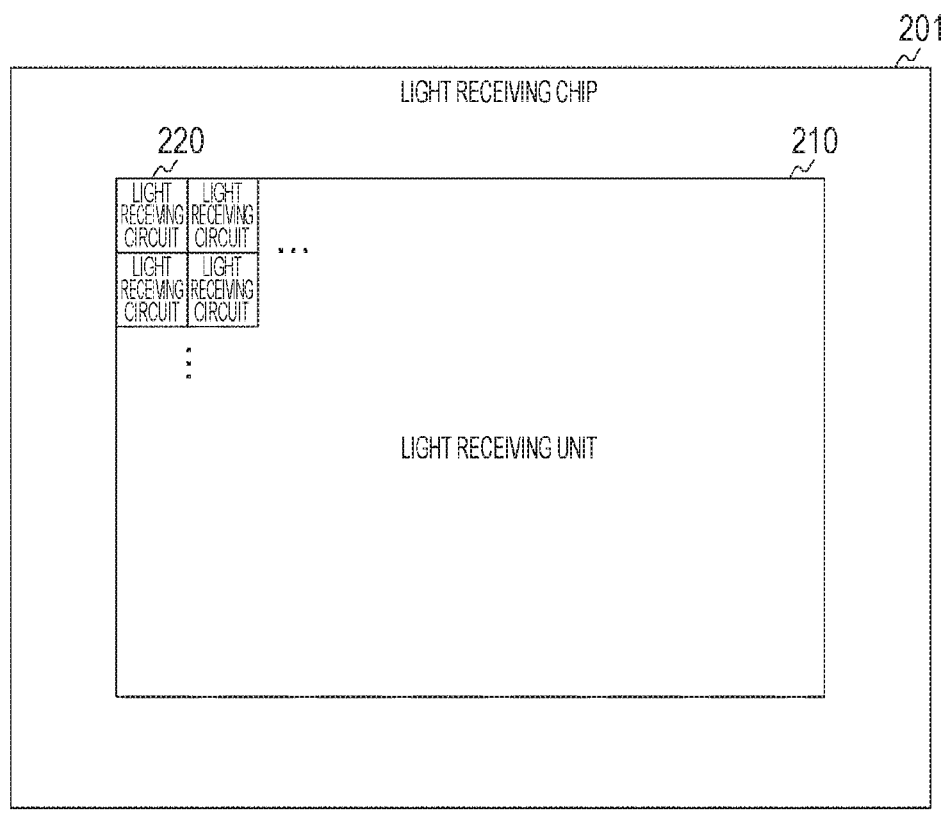
FIG. 3 is a plan view illustrating a configuration example of a light receiving chip according to the first embodiment of the present technology.

FIG. 3 is a plan view illustrating a configuration example of the light receiving chip 201 according to the first embodiment of the present technology. The light receiving chip 201 is provided with a light receiving unit 210, and the light receiving unit 210 is provided with a plurality of light receiving circuits 220 in a two-dimensional lattice manner. Details of the light receiving circuit 220 will be described below.

Configuration Example of Logic Chip

Figure 4:
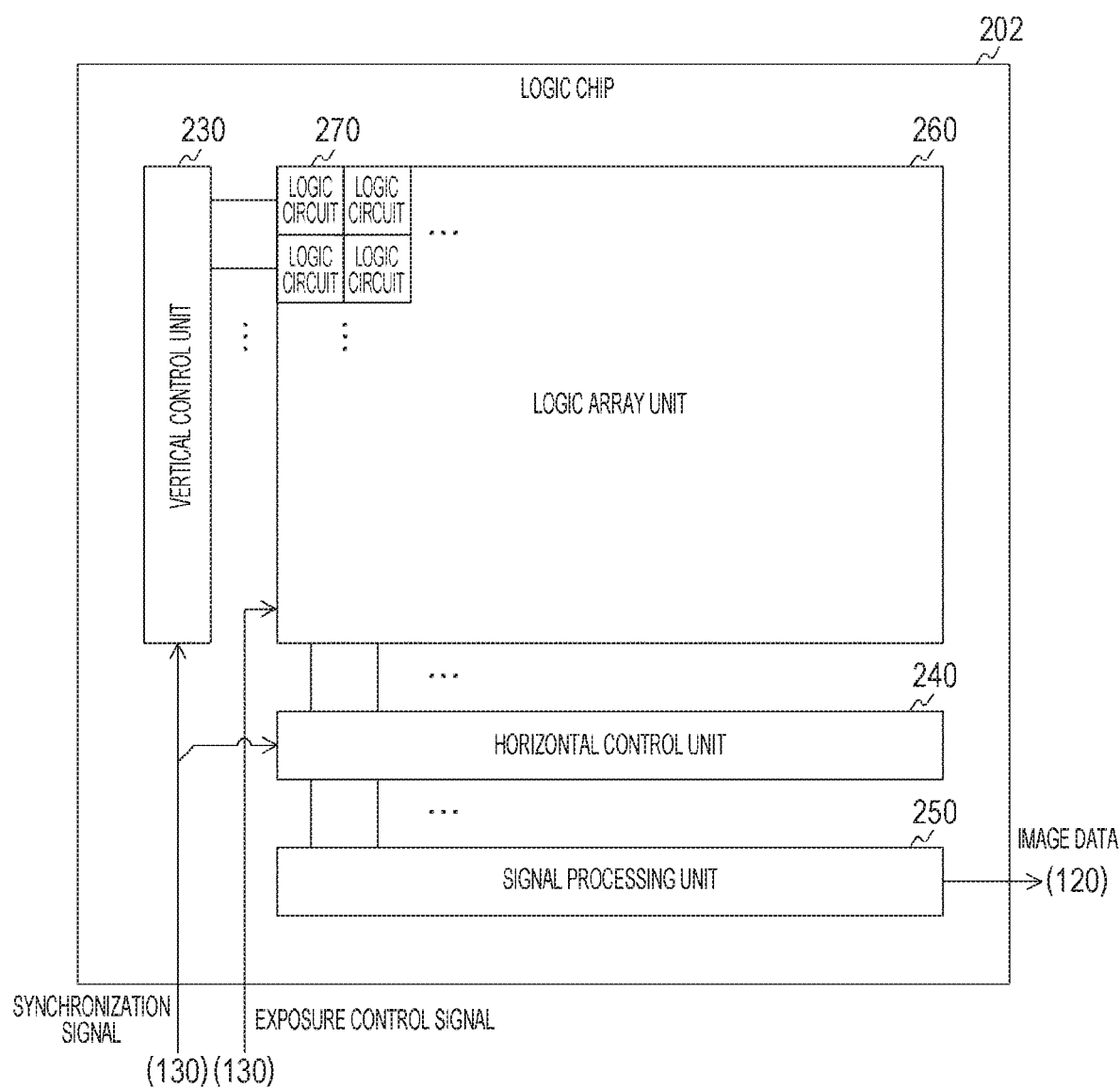
FIG. 4 is a block diagram illustrating a configuration example of a logic chip according to the first embodiment of the present technology.

FIG. 4 is a block diagram illustrating a configuration example of the logic chip 202 according to the first embodiment of the present technology. On the logic chip 202, a vertical control unit 230, a logic array unit 260, a horizontal control unit 240, and a signal processing unit 250 are arranged. Furthermore, in the logic array unit 260, a logic circuit 270 is arranged for each light receiving circuit 220. Each of these logic circuits 270 is connected to the corresponding light receiving circuit 220 via a signal line. A circuit including the light receiving circuit 220 and the logic circuit 270 corresponding to the light receiving circuit 220 functions as a pixel circuit that generates a pixel signal of one pixel in image data.

Then, the vertical synchronization signal is input to the vertical control unit 230, and a horizontal synchronization signal is input to the horizontal control unit 240. The exposure control signal is input to the logic array unit 260.

Hereinafter, a set of pixel circuits (the light receiving circuit 220 and the logic circuit 270) arrayed in a predetermined direction (such as a horizontal direction) is referred to as "row", and a set of pixel circuits arrayed in a direction perpendicular to the row is referred to as column.

The vertical control unit 230 selects a row in order in synchronization with the vertical synchronization signal. The logic circuit 270 counts the number of photons in the exposure period, and outputs a signal indicating a count value as a pixel signal. The horizontal control unit 240 selects a column in order in synchronization with the horizontal synchronization signal and outputs the pixel signal.

The signal processing unit 250 executes predetermined signal processing such as filtering processing to the image data including the pixel signals. The signal processing unit 250 outputs the processed image data to the recording unit 120.

Configuration Example of Pixel Circuit

Figure 5:
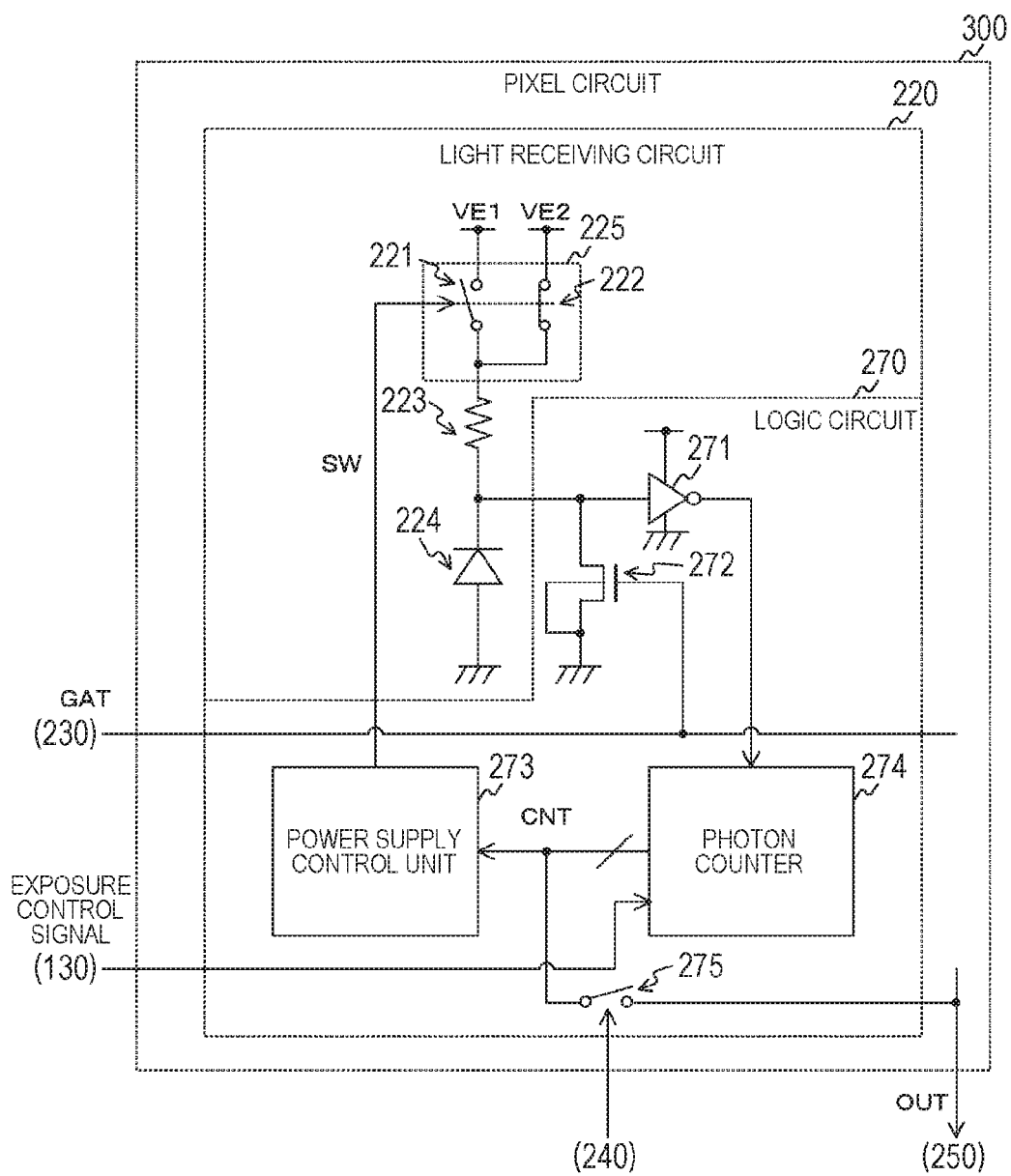
FIG. 5 is a circuit diagram illustrating a configuration example of a pixel circuit according to the first embodiment of the present technology.

FIG. 5 is a circuit diagram illustrating a configuration example of a pixel circuit 300 according to the first embodiment of the present technology. The pixel circuit 300 includes the light receiving circuit 220 and the logic circuit 270. The light receiving circuit 220 includes switches 221 and 222, a resistor 223, and a photodiode 224. Furthermore, the logic circuit 270 includes an inverter 271, a transistor 272, a power supply control unit 273, a photon counter 274, and a switch 275.

The switch 221 opens and closes a path between a terminal of a potential VE1 and the resistor 223 according to a switching signal SW. The switch 222 opens and closes a path between a terminal of a potential VE2 and the resistor 223 according to the switching signal SW. For example, the potential VE1 is set to a value higher than the potential VE2.

A circuit including the switches 221 and 222 functions as a multiplexer 225 that selects one of the potentials VE1 and VE2 according to the switching signal SW. The selected potential is supplied as a power supply potential. Note that the multiplexer 225 is an example of a selection unit described in the claims.

The photodiode 224 photoelectrically converts incident light and outputs a photocurrent. A cathode of the photodiode 224 is connected to the multiplexer 225 via the resistor 223, and an anode is connected to a terminal (such as a ground terminal) having a lower potential than the power supply potential from the multiplexer 225. As a result, a reverse bias is applied to the photodiode 224. Furthermore, the photocurrent flows in a direction from the cathode to the anode of the photodiode 224.

As the photodiode 224, for example, an avalanche photodiode for amplifying a photocurrent is used. Furthermore, use of a single-photon avalanche diode (SPAD) is particularly desirable among avalanche diodes. The SPAD is a type of avalanche photodiodes and is sensitive enough to detect one photon.

One end of the resistor 223 is commonly connected to the multiplexer 225, and the other end of the resistor 223 is connected to the cathode of the photodiode 224. The photocurrent flows through the resistor 223 every time the photocurrent is output, and a cathode potential of the photodiode 224 drops to a lower value than the power supply potential from the multiplexer 225.

The inverter 271 inverts a signal of the cathode potential of the photodiode 224 and outputs the inverted signal to the photon counter 274 as a pulse signal OUT. The inverter 271 outputs a low-level pulse signal OUT in a case where the cathode potential is higher than a predetermined value, and outputs a high-level pulse signal OUT in a case where the cathode potential is equal to or lower than the predetermined value.

A gate signal GAT from the vertical control unit 230 is applied to a gate of the transistor 272, a source of the transistor 272 is connected to a back gate and a ground terminal, and a drain of the transistor 272 is connected to the cathode of the photodiode 224 and an input terminal of the inverter 271. As the transistor 272, for example, an N-type metal oxide semiconductor (MOS) transistor is used. The vertical control unit 230 supplies a low-level gate signal GAT to the selected row, for example.

The photon counter 274 counts the number of times the high-level pulse signal OUT has been output within the exposure period. The photon counter 274 sets a count value CNT to an initial value (for example, "0") at the start of exposure and counts photons over the exposure period. Then, the photon counter 274 stops count at the end of the exposure, and outputs a count value CNT to the power supply control unit 273 and the switch 275.

An incident frequency of photons in incident light on the pixel circuit 300 becomes higher as illuminance of the incident light is higher. Then, a frequency of dropping of the cathode potential of the photodiode 224 becomes higher and an output frequency of the high-level pulse signal becomes higher as the incident frequency of photons is higher. Then, the value of the count value CNT at the end of exposure becomes larger as the output frequency of the pulse signal is higher. That is, the count value CNT is a value obtained by measuring the illuminance. Note that the photon counter 274 is an example of a measuring unit described in the claims.

The power supply control unit 273 controls the power supply potential to a lower value as the count value CNT is larger (that is, the illuminance is higher). The power supply control unit 273 compares, for example, the count value CNT with a predetermined threshold Th1, and supplies the switching signal SW giving an instruction on the lower potential VE2 in a case where the count value CNT is larger than the threshold Th1 (that is, the illuminance is high). On the other hand, the power supply control unit 273 supplies the switching signal SW giving an instruction on the higher potential VE1 in a case where the count value CNT is equal to or smaller than the threshold Th1 (that is, the illuminance is low).

By selecting the lower potential VE2 when the illuminance is high, power consumption of the pixel circuit 300 can be reduced. Variation in brightness is small because the illuminance of the pixel is high although sensitivity of the pixel circuit 300 is decreased due to the selection of the lower potential VE2.

The switch 275 outputs a signal of the count value CNT to the signal processing unit 250 as a pixel signal OUT under the control of the horizontal control unit 240.

Figure 6:
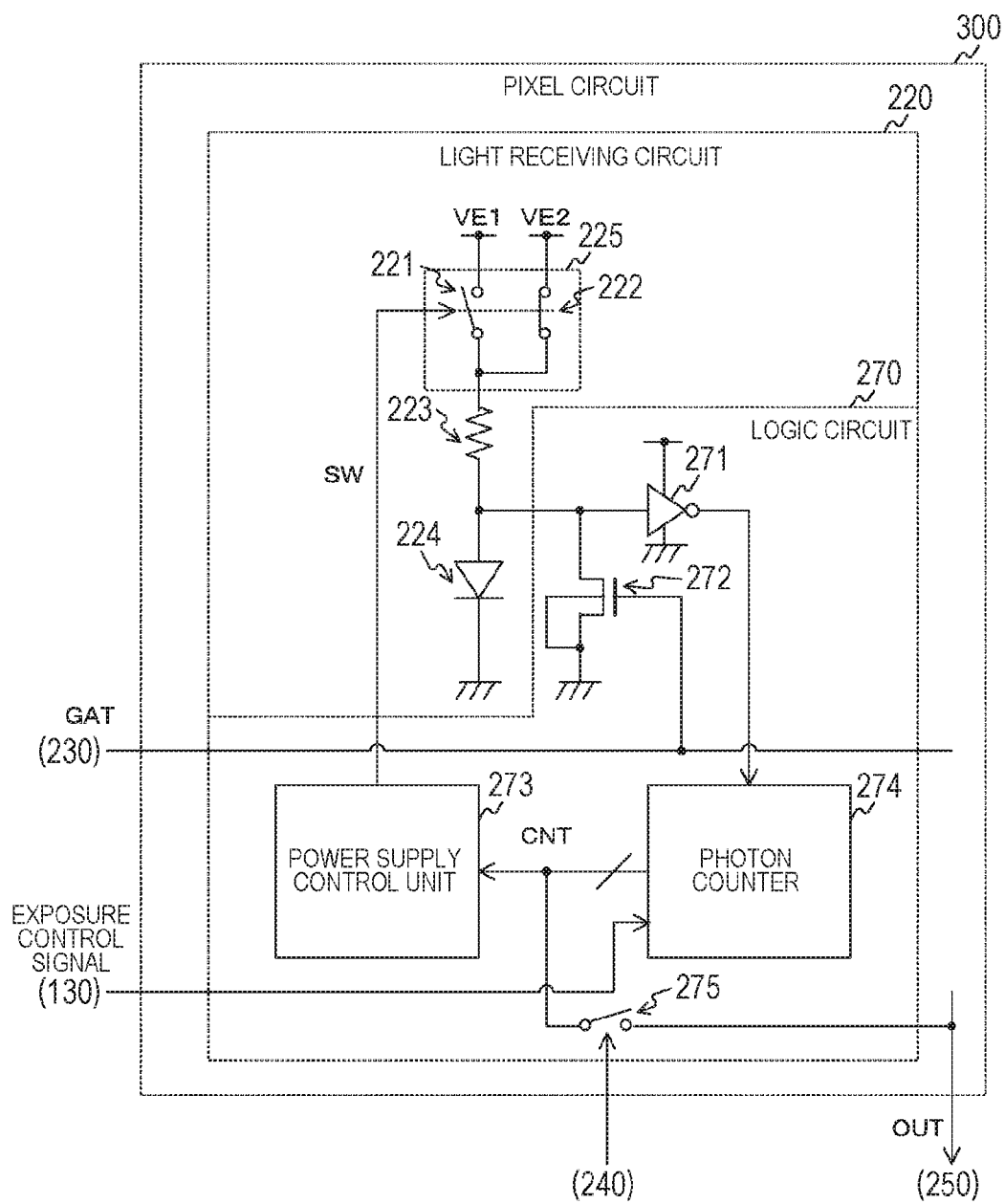
FIG. 6 is a circuit diagram illustrating a configuration example of a pixel circuit when an anode and a cathode are reversed according to the first embodiment of the present technology.

Note that, although the cathode of the photodiode 224 is connected to the resistor 223, the anode can be connected to the resistor 223 as illustrated in FIG. 6.

Operation Example of Imaging Device

Figure 7:
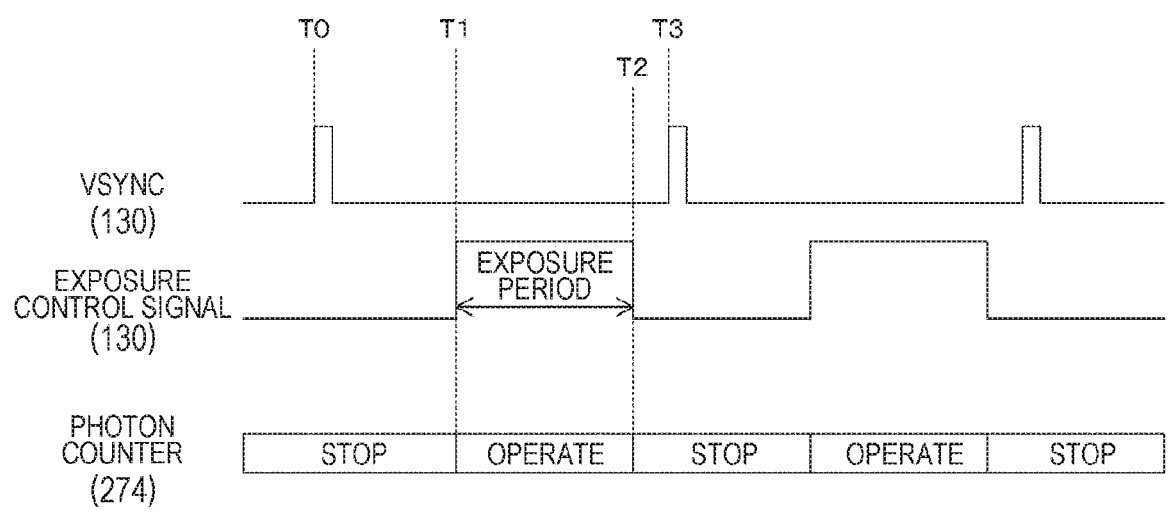
FIG. 7 is a timing chart illustrating an example of an operation of the imaging device according to the first embodiment of the present technology.

FIG. 7 is a timing chart illustrating an example of an operation of the imaging device according to the first embodiment of the present technology. The period from rising timing T0 of a vertical synchronization signal VSYNC to next rising timing T3 corresponds to a cycle of the vertical synchronization signal VSYNC. The exposure period is set within this cycle.

For example, the imaging control unit 130 sets a period from the timing T1 to timing T2 in the cycle as the exposure period, and sets the exposure control signal to a high level over the exposure period. Then, the photon counter 274 operates and counts the count value CNT within the exposure period, and stops the count outside the exposure period.

At the timing T2 at the end of the exposure, the power supply control unit 273 controls the power supply potential according to the count value CNT for each pixel.

FIG. 8 is a diagram illustrating an example of an operation of the power supply control unit 273 according to the first embodiment of the present technology. The power supply control unit 273 compares the count value CNT with the threshold Th1. In the case where the count value CNT is equal to or smaller than the threshold Th1 (that is, the illuminance is low), the power supply control unit 273 sets the switching signal SW to the low level and causes the multiplexer 225 to select the higher potential VE1.

On the other hand, when the count value CNT is larger than the threshold Th1 (that is, the illuminance is high), the power supply control unit 273 sets the switching signal SW to the high level to select the lower potential VE2.

FIG. 9 is a diagram illustrating an example of the power supply potential for each pixel in each of the first embodiment of the present technology and a comparative example. a in FIG. 9 is a diagram illustrating an example of the power supply potential for each pixel in the embodiment of the present technology, and b in FIG. 9 is a diagram illustrating an example of a power supply potential for each pixel in the comparative example in which a constant power supply potential is supplied to all of pixels.

For example, it is assumed that the higher potential VE1 is set to 5 volts (V), and the lower potential VE2 is set to 1 volt (V). As illustrated in a in FIG. 9, in the solid-state image sensor 200, 1 volt is supplied to a pixel on which high illuminance light is incident, and 5 volts is supplied to a pixel on which low illuminance light is incident. Meanwhile, as illustrated in b in FIG. 9, 5 volts is supplied to all the pixels in the comparative example.

Here, power consumption P of the pixel circuit 300 is expressed by the following expression, for example:

$$P = C \times VE \times dV$$

In the above expression, C represents a cathode capacitance, and the unit is, for example, Farad (F). VE represents the power supply potential, and dV is a potential difference between the anode and the cathode of the photodiode 224.

The potential difference dV is caused to be constant. Furthermore, since the cathode capacitance C is constant, the power consumption of the pixel can be reduced by lowering the power supply potential of the pixel circuit 300 according to the above expression. If the power supply potentials of 30% of all the pixels are decreased to 1 volt (V), the ratio of the power consumption to a case where the power supply potentials of all the pixels are set to 5 volts is expressed by the following expression.

$$\tfrac{1}{5} \times 0.3 = 0.24$$

That is, when the power consumption of the case where the power supply potentials of all the pixels are set to 5 volts (V) is 100 percent (%), and the power supply potentials of 30% of all the pixels are set to 1 volt (V), the power consumption decreases to 24 percent (%). In a case of imaging an image in which pixels on which high illuminance light is incident and pixels on which low illuminance light is incident are mixed as described above, the power supply potentials of the latter pixels are decreased, whereby the power consumption of the solid-state image sensor 200 can be reduced, as compared with the case of supplying the same potential to all of pixels.

Figure 10:
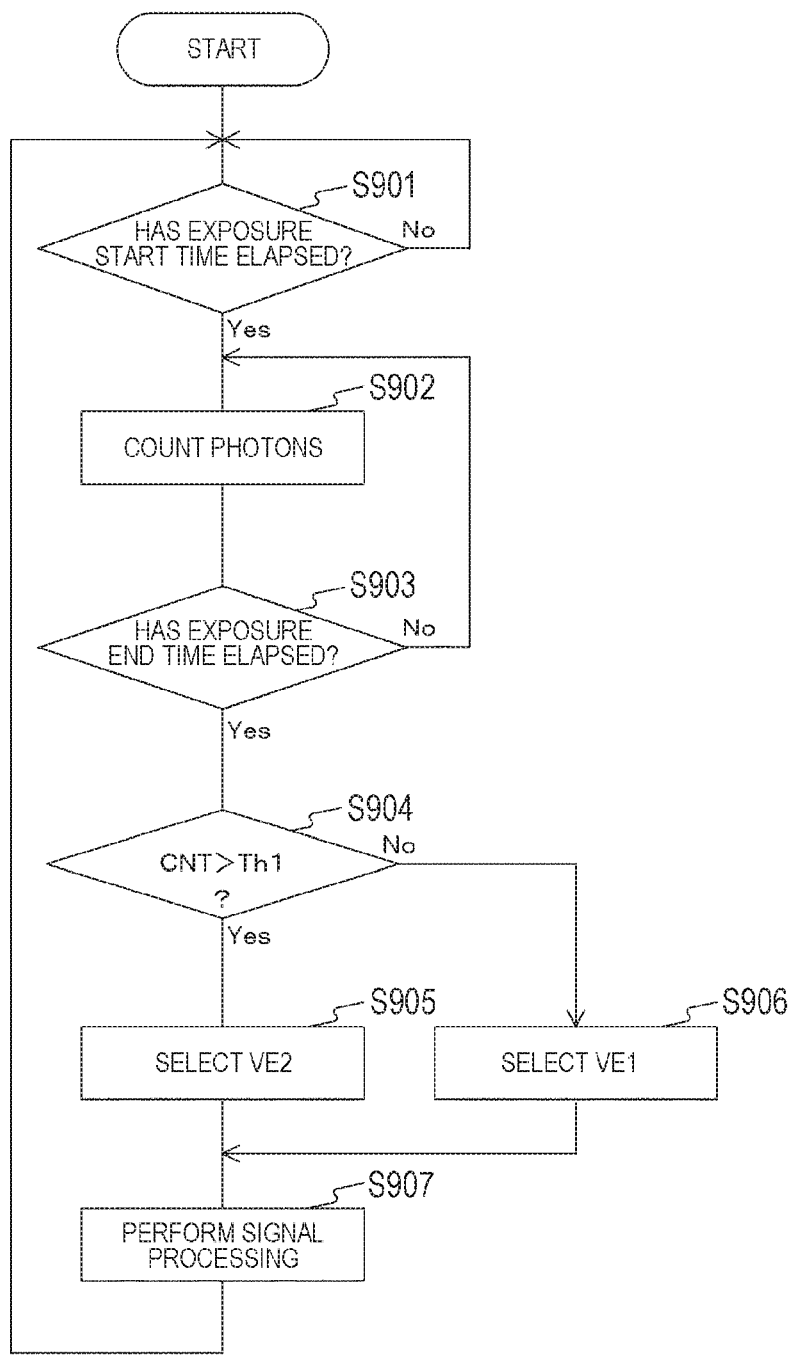
FIG. 10 is a flowchart illustrating an example of an operation of the imaging device according to the first embodiment of the present technology.

FIG. 10 is a flowchart illustrating an example of an operation of the imaging device 100 according to the first embodiment of the present technology. This operation is started when, for example, a predetermined application for imaging image data is executed.

The imaging device 100 determines whether or not an exposure start time has elapsed (step S901). In a case where the time is before the exposure start time (step S901: No), the imaging device 100 repeats step S901.

On the other hand, in a case where the exposure start time has elapsed (step S901: Yes), the imaging device 100 counts the count value CNT (that is, performs photon count) for each pixel (step S902). Then, the imaging device 100 determines whether or not an exposure end time has elapsed (step S903). In a case where the time is before the exposure end time (step S903: No), the imaging device 100 repeats step S902.

On the other hand, in a case where the exposure end time has elapsed (step S903: Yes), each pixel circuit 300 in the imaging device 100 determines whether or not the count value CNT is larger than the threshold Th1 (step S904). In a case where the count value CNT is larger than the threshold Th1 (step S904: Yes), the pixel circuit 300 selects the lower potential VE2 as the power supply potential (step S905). On the other hand, in a case where the count value CNT is equal to or smaller than the threshold Th1 (step S904: No), the pixel circuit 300 selects the higher potential VE1 (step S906). After step S905 or S906, the imaging device 100 performs signal processing for image data (step S907). After step S907, the imaging device 100 repeatedly executes step S901 and subsequent steps. Note that steps S904 to S905 are executed for each pixel of all the pixels.

As described above, in the embodiment of the present technology, the power supply control unit 273 in the pixel circuit 300 controls the power supply potential to a lower value as the illuminance is higher, the power consumption of the pixel circuit 300 on which high illuminance light is incident can be reduced.

[Modification]

In the above-described first embodiment, the power supply control unit 273 has controlled the power supply potential to either the potential VE1 or VE2 according to the illuminance. However, there are some cases where the potential VE1 is too high or the potential VE2 is too low. Therefore, it is desirable to more finely control the power supply potential. The pixel circuit 300 of a modification of the first embodiment is different from that of the first embodiment in controlling the power supply potential in three stages according to illuminance.

Figure 11:
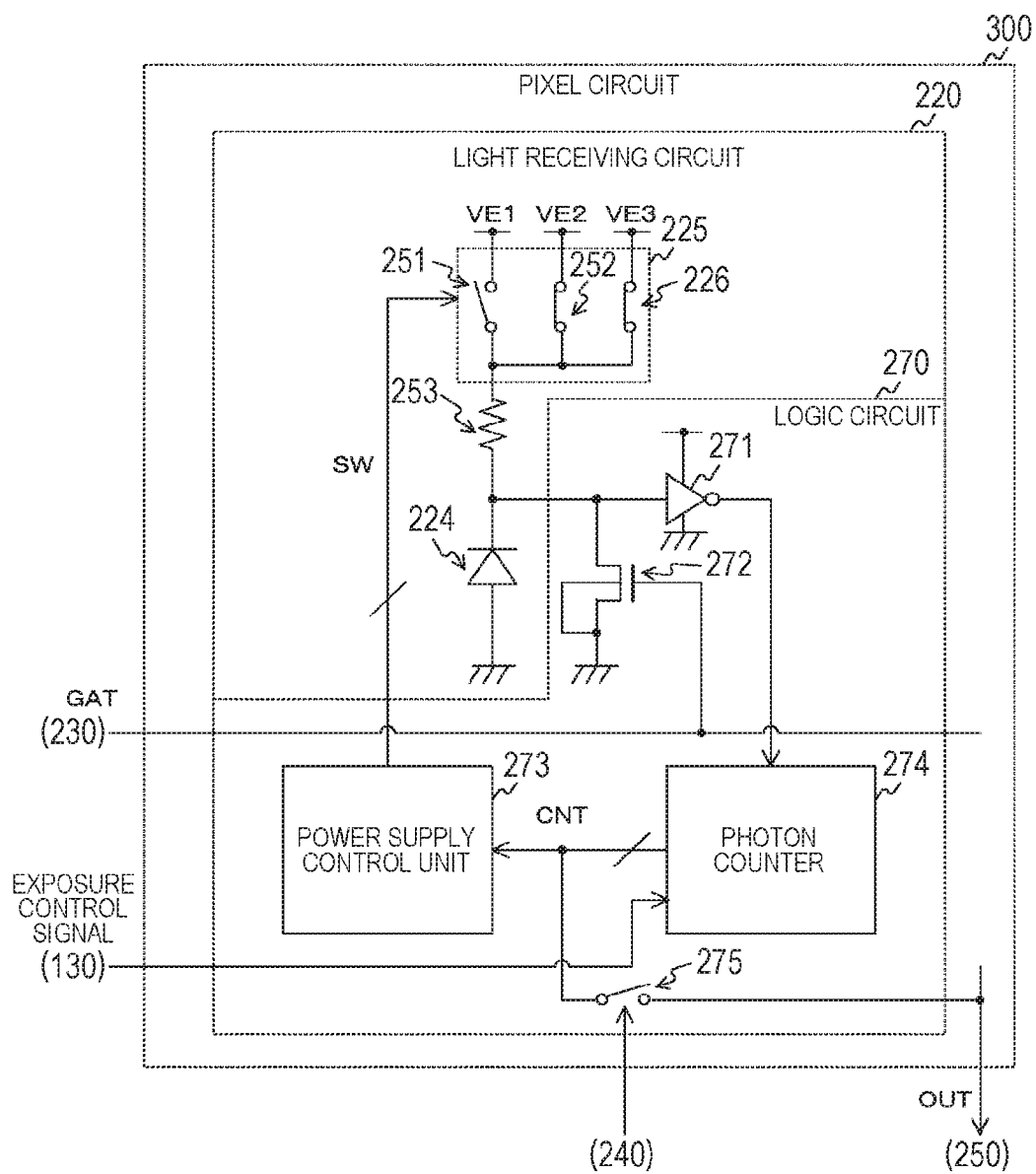
FIG. 11 is a circuit diagram illustrating a configuration example of a pixel circuit according to a modification of the first embodiment of the present technology.

FIG. 11 is a circuit diagram illustrating a configuration example of the pixel circuit 300 according to the modification of the first embodiment of the present technology. The pixel circuit 300 according to the modification of the embodiment is different from the pixel circuit 300 of the embodiment in that the multiplexer 225 further includes a switch 226.

The switch 226 opens and closes a path between a terminal of a potential VE3 and one end of the resistor 223 according to the switching signal SW. A value lower than the potential VE2 is set as the potential VE3.

Furthermore, the power supply control unit 273 according to the modification of the first embodiment compares the count value CNT with two thresholds and supplies any one of the potentials VE1 to VE3 to the multiplexer 225 on the basis of a result of the comparison.

FIG. 12 is a diagram illustrating an example of an operation of the power supply control unit 273 according to the modification of the first embodiment of the present technology. In the case where the count value CNT is equal to or smaller than the threshold Th1 (that is, the illuminance is low), the power supply control unit 273 sets the switching signal SW to "0" to select the highest potential VE1.

Furthermore, in a case where the count value CNT is larger than the threshold Th1 and is equal to or smaller than the threshold Th2 (that is, the illuminance is in an intermediate level), the power supply control unit 273 sets the switching signal SW to "1" to select the intermediate potential VE2. Here, the threshold Th2 is a value larger than the threshold Th1.

Furthermore, in a case where the count value CNT is larger than the threshold Th2 (that is, the illuminance is high), the power supply control unit 273 sets the switching signal SW to "2" to select the lowest potential VE3.

Note that the power supply control unit 273 controls the power supply potential in three stages by comparing the count value CNT with the two threshold values. However, the power supply control unit 273 can compare the count value CNT with N (N is an integer of 3 or larger) thresholds and control the power supply potential in (N+1) or more stages.

As described above, in the modification of the first embodiment of the present technology, the power supply control unit 273 controls the power supply potential to any one of the potentials VE1 to VE3 according to the illuminance, thereby controlling the power supply potential to a more appropriate value than the case of controlling the power supply potential to either the potential VE1 or VE2.

Configuration Example of Logic Chip

Figure 13:
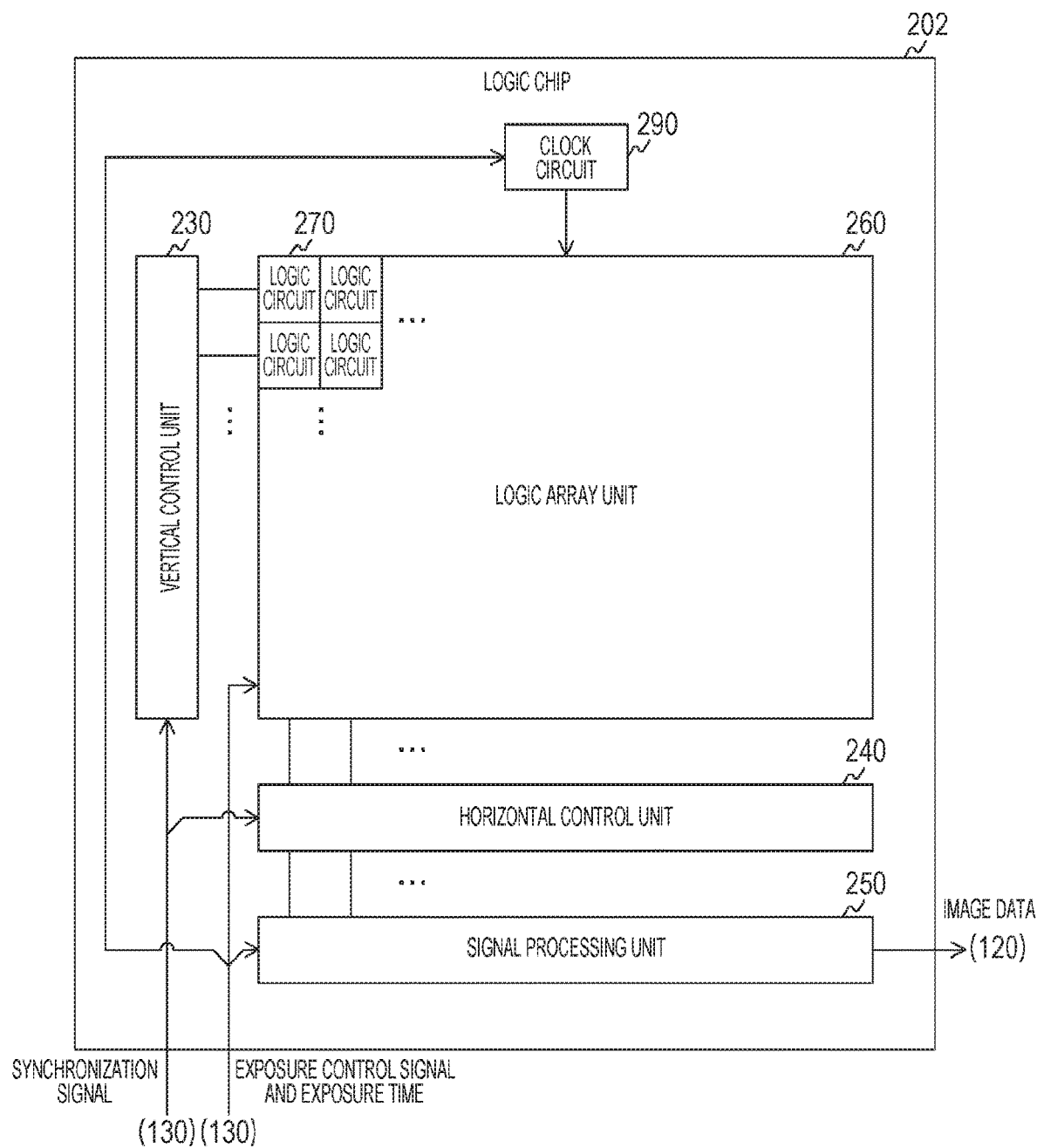
FIG. 13 is a block diagram illustrating a configuration example of a logic chip according to a second embodiment of the present technology.

FIG. 13 is a block diagram illustrating a configuration example of a logic chip 202 according to a second embodiment of the present technology. On the logic chip 202, a vertical control unit 230, a logic array unit 260, a horizontal control unit 240, a signal processing unit 250, and a clock circuit 290 are arranged. Furthermore, in the logic array unit 260, a logic circuit 270 is arranged for each light receiving circuit 220. Each of these logic circuits 270 is connected to the corresponding light receiving circuit 220 via a signal line. A circuit including the light receiving circuit 220 and the logic circuit 270 corresponding to the light receiving circuit 220 functions as a pixel circuit that generates a pixel signal of one pixel in image data.

Then, a vertical synchronization signal is input to the vertical control unit 230, and a horizontal synchronization signal is input to the horizontal control unit 240. An exposure control signal from an imaging control unit 130 is input to the logic array unit 260. The exposure control signal is input to the clock circuit 290.

Hereinafter, a set of pixel circuits (the light receiving circuit 220 and the logic circuit 270) arrayed in a predetermined direction (such as a horizontal direction) is referred to as "row", and a set of pixel circuits arrayed in a direction perpendicular to the row is referred to as column.

The vertical control unit 230 selects a row in order in synchronization with the vertical synchronization signal. The logic circuit 270 counts the number of times a photon is incident within an exposure period, and outputs a signal indicating a counted value to the signal processing unit 250 as a pixel signal. The horizontal control unit 240 selects a column in order in synchronization with the horizontal synchronization signal and outputs the pixel signal.

The signal processing unit 250 executes predetermined signal processing such as filtering processing to the image data including the pixel signals. The signal processing unit 250 outputs the processed image data to a recording unit 120. Furthermore, an exposure time from the imaging control unit 130 is input to the signal processing unit 250. Furthermore, the signal processing unit 250 estimates the number of incident times of a photon within the exposure period. Details of the estimation method will be described below.

The clock circuit 290 measures a relative time within the exposure period according to the exposure control signal. The clock circuit 290 inputs a timer value indicating the measured time to each of the logic circuits 270.

Configuration Example of Pixel Circuit

Figure 14:
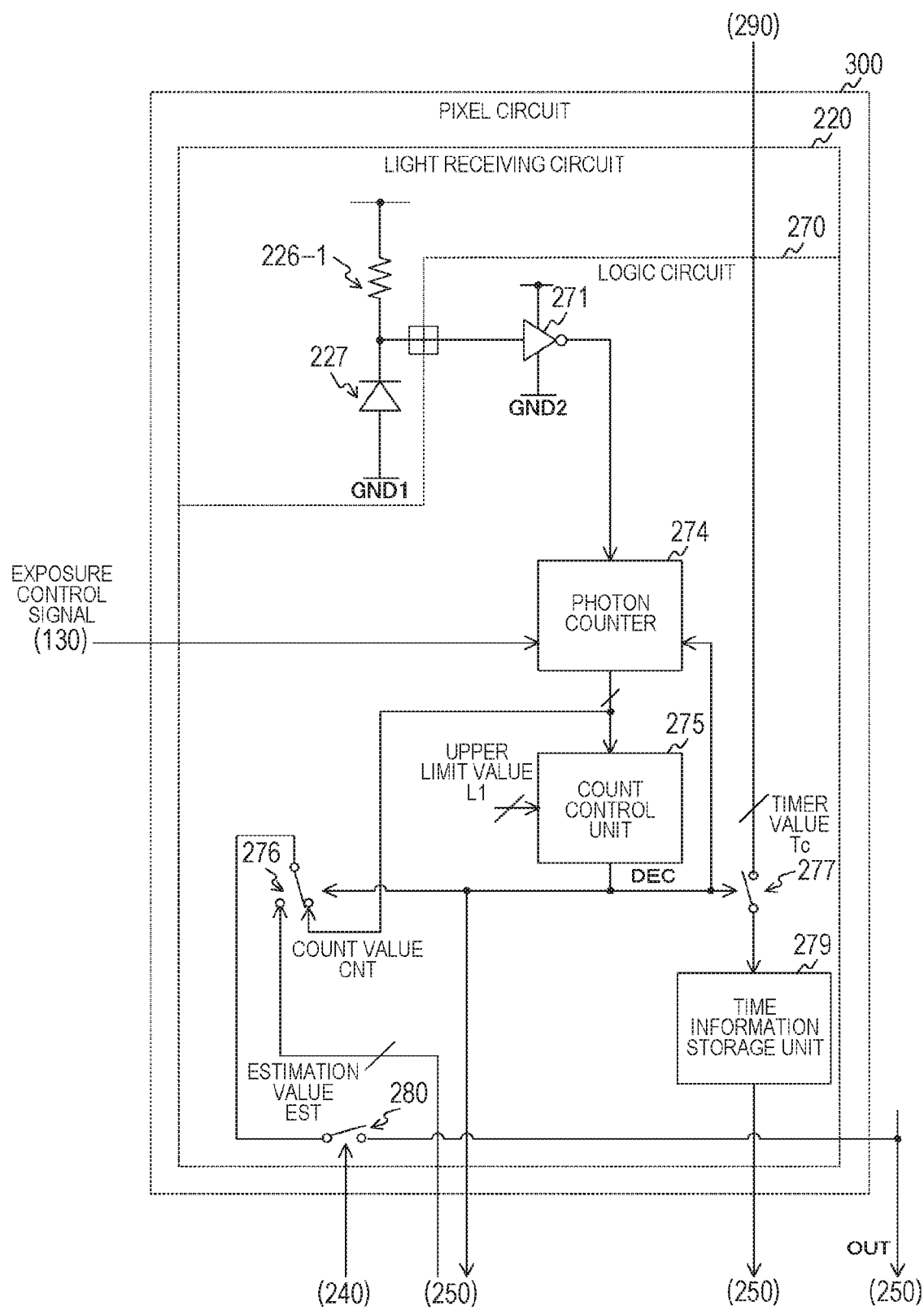
FIG. 14 is a circuit diagram illustrating a configuration example of a pixel circuit according to the second embodiment of the present technology.

FIG. 14 is a circuit diagram illustrating a configuration example of a pixel circuit 300 according to the second embodiment of the present technology. The pixel circuit 300 includes the light receiving circuit 220 and the logic circuit 270. The light receiving circuit 220 includes a resistor 226-1 and a photodiode 227. Furthermore, the logic circuit 270 includes an inverter 271, a photon counter 274, a count control unit 275, switches 276, 277, and 280, and a time information storage unit 279.

The photodiode 227 photoelectrically converts incident light and outputs a photocurrent. A cathode of the photodiode 227 is connected to a terminal of a power supply potential via the resistor 226-1, and an anode of the photodiode 227 is connected to a terminal (such as a ground terminal) of a potential GND1 lower than the power supply potential. As a result, a reverse bias is applied to the photodiode 227. Furthermore, the photocurrent flows in a direction from the cathode to the anode of the photodiode 227.

As the photodiode 227, for example, an avalanche photodiode capable of detecting the presence or absence of incidence of one photon by amplifying a photocurrent is used. Furthermore, use of an SPAD is particularly desirable among avalanche diodes.

One end of the resistor 226-1 is connected to a terminal of the power supply potential, and the other end of the resistor 226-1 is connected to the cathode of the photodiode 227. The photocurrent flows through the resistor 226-1 every time incidence of a photon is detected, and a cathode potential of the photodiode 227 drops to a value in an initial state, which is lower than the power supply potential.

The inverter 271 inverts a signal of the cathode potential of the photodiode 227 and outputs the inverted signal to the photon counter 274 as a pulse signal. The inverter 271 outputs a low-level pulse signal in a case where the cathode potential is higher than a predetermined value, and outputs a high-level pulse signal in a case where the cathode potential is equal to or lower than the predetermined value. Furthermore, a potential GND2 on the ground side to which the inverter 271 is connected is different from a potential GND2 in the light receiving circuit 220.

The photon counter 274 counts the number of times the high-level pulse signal has been output within the exposure period. This count value indicates the number of times the potential (cathode potential or the like) of one end of a photodiode 222 has varied due to detection of the presence or absence of incidence of photons. Assuming that a ratio of the number of pulses to an actual number of incident photons is ⅒, one count is performed every time 10 photons are incident.

The photon counter 274 sets a count value CNT to an initial value (for example, "0") at the start of exposure, and performs count over the exposure period. The count value is incremented, for example, every time a pulse signal is output. That is, an up-count is performed. Then, the photon counter 274 stops the count at the end of the exposure or under the control of the count control unit 275, and outputs the count value CNT to the count control unit 275 and the switch 276.

Note that the photon counter 274 is an example of a count unit described in the claims. Furthermore, the photon counter 274 performs up-count but may perform down-count instead of up-count.

The count control unit 275 stops the photon counter 274 in a case where the count value CNT has reached a predetermined limit value. In the case of up-count, an upper limit value L1 is used as the limit value. The upper limit value L1 is a value equal to or less than the maximum value that can be counted by the photon counter 274, and is set in a register or the like in advance. For example, in a case where an 8-bit counter is used as the photon counter 274, a value equal to or less than "255" (such as "254" or "255") is set as the upper limit value L1.

The count control unit 275 determines whether or not the count value CNT has reached the upper limit value L1 within the exposure period, and outputs a determination result DEC to the photon counter 274, the switch 276, the switch 277, and the signal processing unit 250. Note that, in the case where down-count is performed, a lower limit value is used instead of the upper limit value.

The switch 277 causes the time information storage unit 279 to store a timer value Tc from the clock circuit 290 according to the determination result DEC. The switch 277 causes the time information storage unit 279 to store the timer value Tc when the count value CNT has reached the upper limit value L1. The time information storage unit 279 stores the timer value Tc.

Furthermore, the signal processing unit 250 estimates the number of incident times of a photon within the exposure period on the basis of the time (timer value Tc) to stop the photon counter 274. The signal processing unit 250 performs estimation according to the following expression using an exposure time Te from the imaging control unit 130, the timer value Tc stored in the time information storage unit 279, and the upper limit value L1. Note that the signal processing unit 250 is an example of an estimation unit described in the claims.

$$EST = L1 \times (Te/Tc) \qquad \text{Expression 1}$$

In the above expression, EST is a count value of a case where the photon counter 274 is assumed to perform count without stopping until the exposure period elapses, and this value indicates an exposure amount within the exposure period. The signal processing unit 250 outputs EST to the switch 276 as an estimation value.

The switch 276 selects one of the count value CNT and the estimation value EST according to the determination result DEC. This switch 276 selects the estimation value EST in a case where the count value CNT has reached the predetermined limit value, and outputs the estimation value EST to the switch 280 as an output value OUT. On the other hand, in a case where the count value CNT has not reached the predetermined limit value, the switch 276 selects the count value CNT and supplies the count value CNT to the switch 280 as the output value OUT.

The switch 280 outputs a signal of the output value OUT to the signal processing unit 250 as a pixel signal under the control of the horizontal control unit 240.

Figure 15:
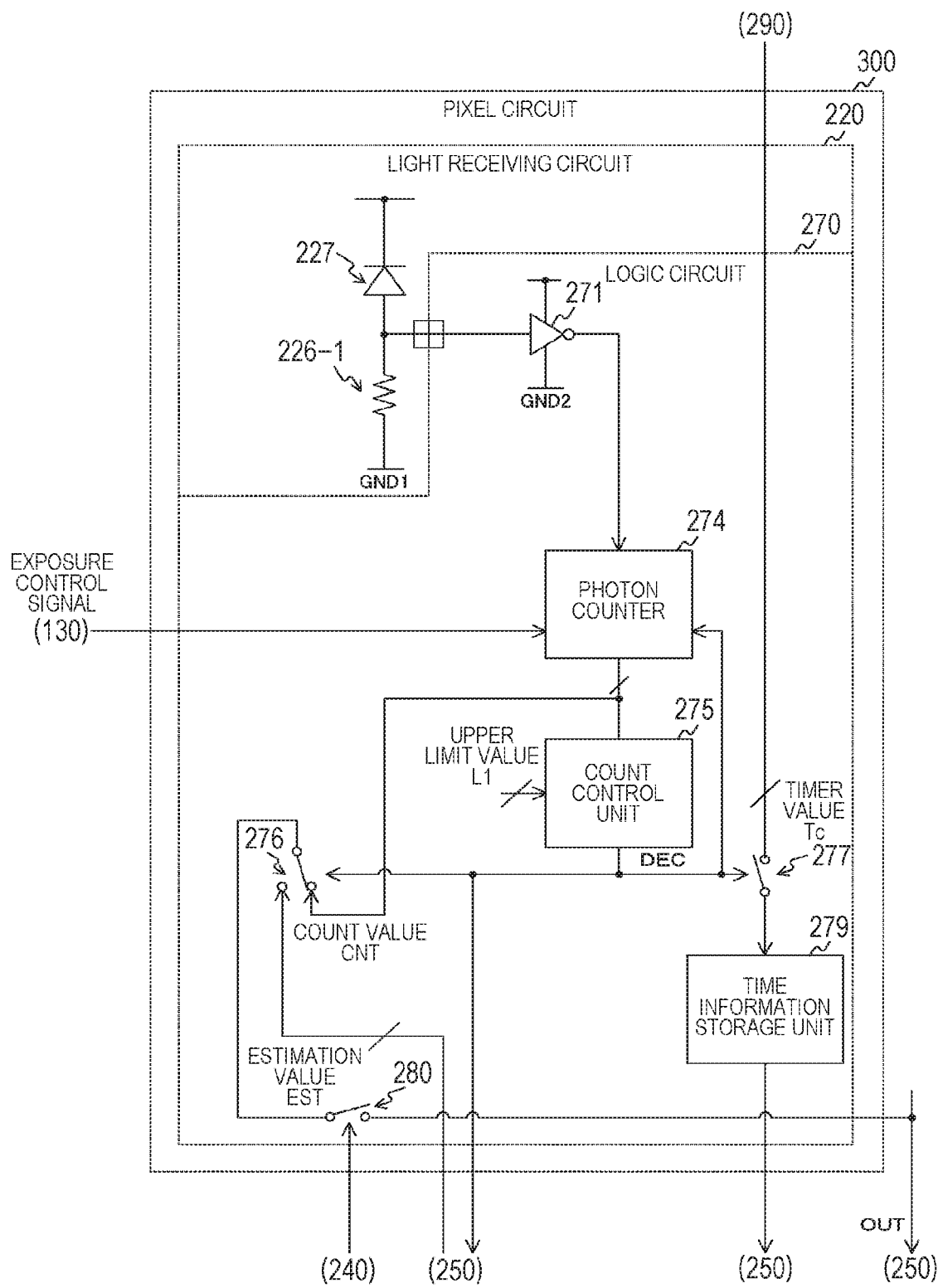
FIG. 15 is a circuit diagram illustrating a configuration example of a pixel circuit when an anode and a cathode are reversed according to the second embodiment of the present technology.

Note that, although the cathode of the photodiode 227 is connected to the resistor 226-1, the anode may be connected to the resistor 226-1 as illustrated in FIG. 15.

FIG. 16 is a diagram illustrating an example of an operation of the photon counter 274 according to the second embodiment of the present technology. The exposure control signal and the determination result DEC are input to the photon counter 274. Here, for example, "1" is set to the exposure control signal within the exposure period, and "0" is set to the exposure control signal outside the exposure period. Furthermore, for example, "1" is set to the determination result DEC in a case where the count value CNT has reached the upper limit value L1, and "0" is set to the determination result DEC in a case where the count value CNT is less than the upper limit value L1.

In the case where the exposure control signal is "0" (that is, outside the exposure period), the photon counter 274 stops the count operation regardless of the value of the determination result DEC. Meanwhile, in the case where the exposure control signal is "1" (that is, within the exposure period), the photon counter 274 continuously performs the count operation when the determination result DEC is "0" (that is, the count value CNT is less than the upper limit value L1). However, when the determination result DEC is "1" (that is, the count value CNT is the upper limit value L1), the photon counter 274 stops the count operation.

FIG. 17 is a diagram illustrating an example of an operation of the count control unit 275 according to the second embodiment of the present technology. In the case where the count value CNT is less than the upper limit value L1, the count control unit 275 outputs the determination result DEC of "0" to cause the photon counter 274 to continuously perform the count operation. Meanwhile, in the case where the count value CNT is the upper limit value L1, the count control unit 275 outputs the determination result DEC of "1" to cause the photon counter 274 to stop the count operation.

FIG. 18 is a diagram illustrating an example of an operation of the signal processing unit 250 according to the second embodiment of the present technology. In the case where the determination result DEC is "0" (that is, the count value CNT is less than the upper limit value L1), the signal processing unit 250 stops calculation of the estimation value without executing the calculation. Meanwhile, in the case where the determination result DEC is "1" (that is, the count value CNT is the upper limit value L1), the signal processing unit 250 calculates the estimation value EST using the expression 1.

Figure 19:
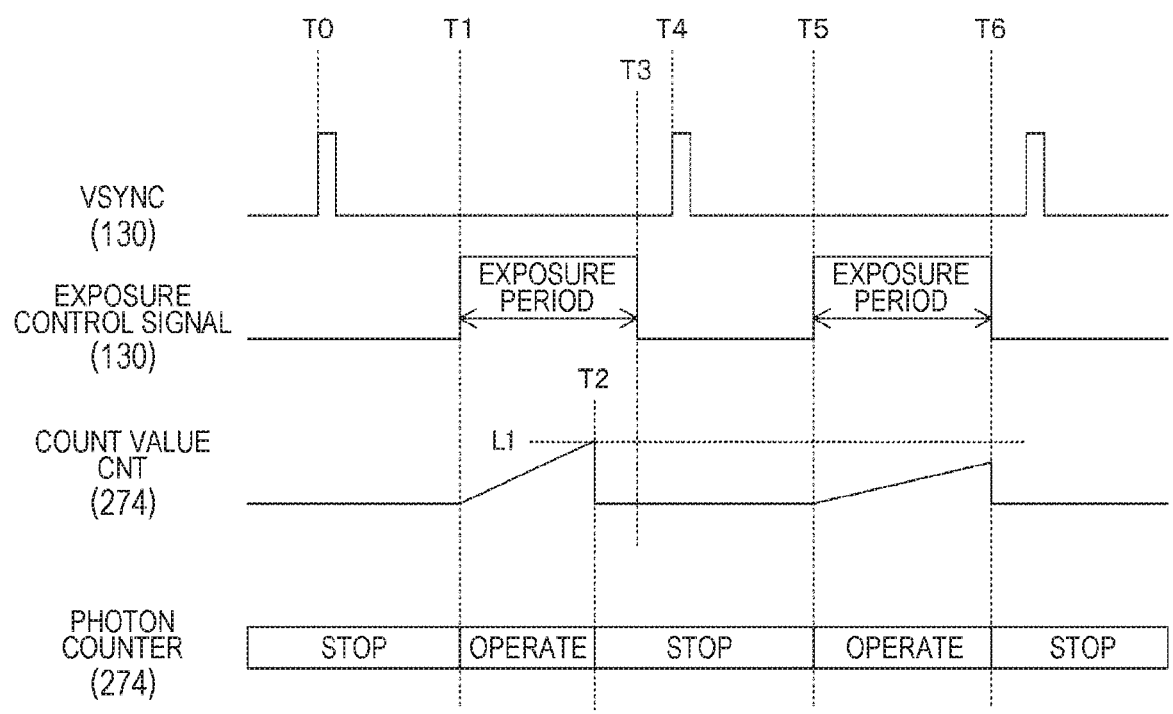
FIG. 19 is a timing chart illustrating an example of an operation of the imaging device according to the second embodiment of the present technology.

FIG. 19 is a timing chart illustrating an example of an operation of an imaging device 100 according to the second embodiment of the present technology. A period from rising timing T0 of a vertical synchronization signal VSYNC to next rising timing T4 corresponds to a cycle of the vertical synchronization signal VSYNC. The exposure period is set within this cycle.

For example, the imaging control unit 130 sets a period from the timing T1 to timing T3 in the cycle as the exposure period, and sets the exposure control signal to a high level over the exposure period. Then, the photon counter 274 operates and counts the count value CNT within the exposure period. Then, when the count value CNT has reached the upper limit value L1 at timing T2 within the exposure period, the count control unit 275 causes the photon counter 274 to stop the count. The photon counter 274 sets the count value to an initial value at the stop of the operation.

Furthermore, after the next rising timing T4 of the vertical synchronization signal VSYNC, the imaging control unit 130 sets a period from timing T5 to timing T6 in the cycle as the exposure period. The photon counter 274 operates and counts the count value CNT within the exposure period. Since the count value CNT has not reached the upper limit value L1 during this exposure period, the photon counter 274 stops the count at the end of the exposure period.

As described above, the photon counter 274 stops the count when the count value CNT reaches the upper limit value L1 during the exposure period. Here, in general, the power consumption of the counter becomes larger as the number of count times increases. Therefore, the photon counter 274 stops the count in the middle of the exposure period, thereby reducing the power consumption, as compared with a case of continuing the count without stopping. However, in the case of stopping the count in the middle of the exposure period, the count value CNT (that is, the upper limit value L1) at that time is different from a value of the case of counting the count value CNT until the end of the exposure period without stopping, and is no longer the value according to the exposure amount during the exposure period. Therefore, the signal processing unit 250 estimates the count value (that is, the exposure amount) at the end of the exposure period.

Figure 20:
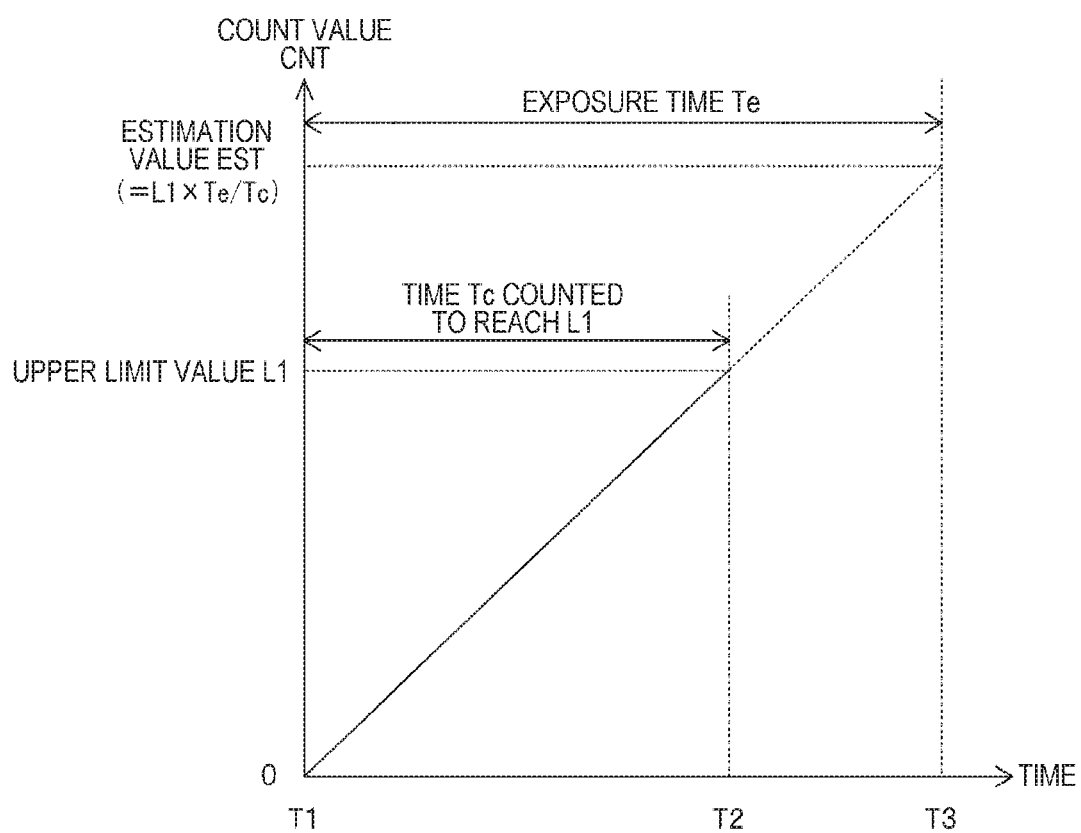
FIG. 20 is a diagram illustrating an example of variation in a count value according to the second embodiment of the present technology.

FIG. 20 is a diagram illustrating an example of variation in the count value according to the second embodiment of the present technology. In FIG. 20, the vertical axis represents the count value CNT, and the horizontal axis represents a counting time. The timing T1 is an exposure start time, and the timing T3 is an exposure end time. The time from the timing T1 to T3 corresponds to the exposure time Te.

At the timing T1, the photon counter 274 starts count, and the count value CNT increases with time. An increasing speed of the count value CNT becomes substantially constant in a case where there is almost no change in illuminance during the exposure period, and the increasing speed becomes faster as the illuminance is higher. Then, it is assumed that the count value CNT has reached the upper limit value L1 at the timing T2. At this timing T2, the photon counter 274 stops the count.

Then, the signal processing unit 250 substitutes a time Tc from the timing T1 to T2, the exposure time Te, and the upper limit value L1 into the expression 1, and calculates the count value at the end of the exposure as the estimation value EST.

In a case where the maximum value that can be counted by the photon counter 274 is the upper limit value L1, the solid-state image sensor 200 can estimate the count value according to the exposure amount even in a case of receiving light of an amount exceeding a light amount corresponding to the upper limit value L1.

Meanwhile, assuming a comparative example in which the count is not stopped during the exposure period, there is a possibility that an accurate count value may not be able to be obtained if the exposure amount is large in the comparative example. For example, in a case of using an 8-bit counter, when light of an amount exceeding a light amount corresponding to "255", the count value overflows and becomes an inaccurate value in the comparative example. To avoid the overflow, a counter having a sufficiently large number of digits may be used. However, the power consumption, circuit scale, and cost of the counter increase as the number of digits becomes larger, which is not desirable.

Meanwhile, in the solid-state image sensor 200, the signal processing unit 250 estimates the count value at the end of the exposure using the expression 1. Therefore, an accurate count value according to the exposure amount can be obtained. Furthermore, since use of the counter having a large number of digits is not necessary, the power consumption and the like can be reduced.

Furthermore, the power consumption can be reduced by making the upper limit value L1 smaller. However, an error in the estimation value EST becomes larger instead. The value of the upper limit value L1 is determined in consideration of the advantage of the reduction of the power consumption and the disadvantage of the decrease in the accuracy of the estimation value EST.

Operation Example of Pixel Circuit

Figure 21:
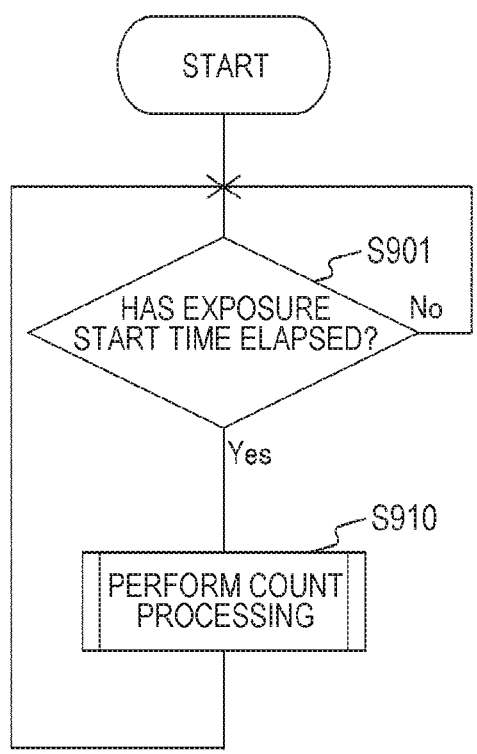
FIG. 21 is a flowchart illustrating an example of an operation of the pixel circuit according to the second embodiment of the present technology.

FIG. 21 is a flowchart illustrating an example of an operation of the pixel circuit 300 according to the second embodiment of the present technology. This operation is started when, for example, a predetermined application for imaging image data is executed.

The pixel circuit 300 determines whether or not the exposure start time has elapsed (step S901).

In a case where the exposure start time has elapsed (step S901: Yes), the pixel circuit 300 performs count processing of counting the count value CNT (that is, photon count) (step S910). In a case where the time is before the exposure start time (step S901: No) or after step S910, the pixel circuit 300 repeats step S901 and subsequent steps.

Figure 22:
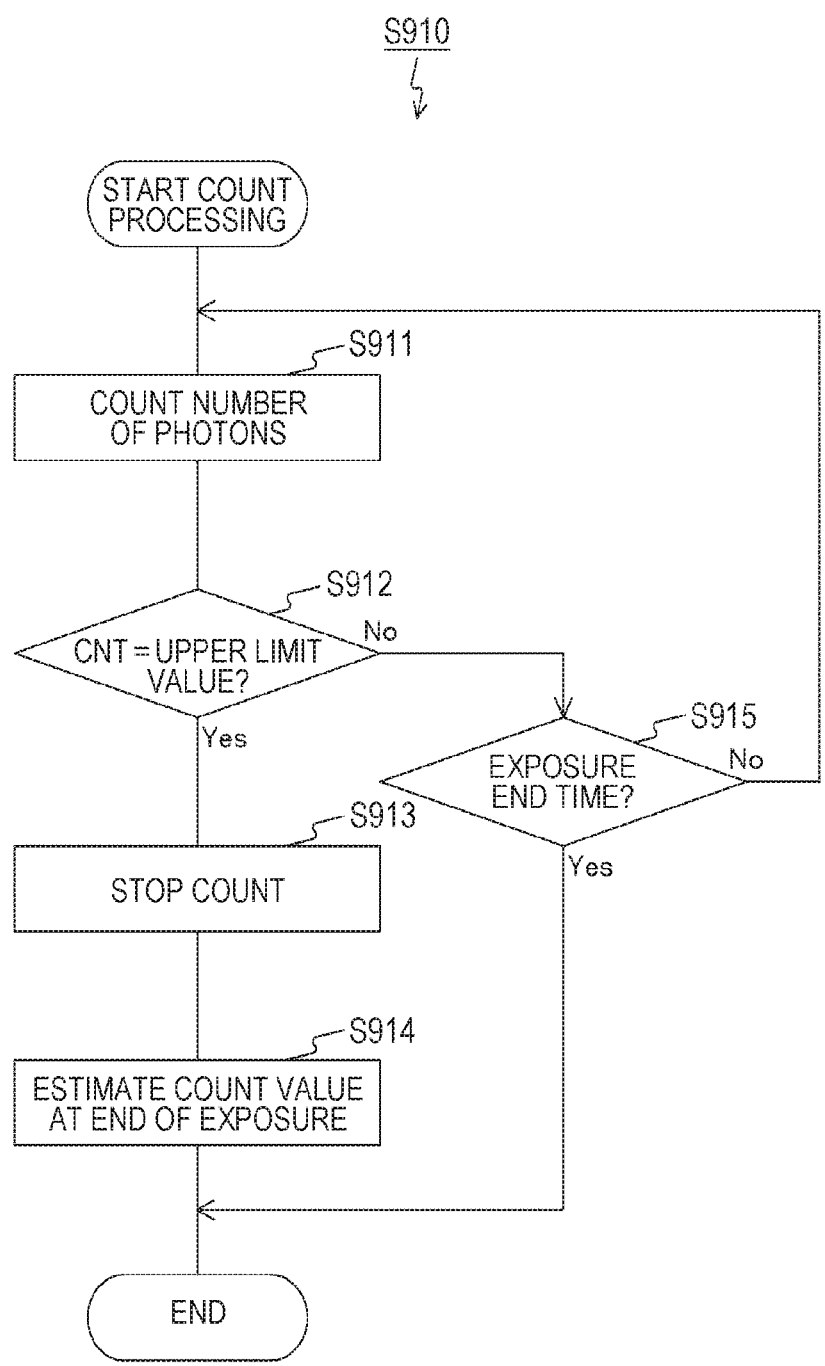
FIG. 22 is a flowchart illustrating an example of count processing according to the second embodiment of the present technology.

FIG. 22 is a flowchart illustrating an example of the count processing according to the first embodiment of the present technology. The photon counter 274 in the pixel circuit 300 counts the number of photons (step S911), and the count control unit 275 determines whether or not the count value CNT has reached the upper limit value L1 (step S912).

In a case where the count value CNT has reached the upper limit value L1 (step S912: Yes), the photon counter 274 stops the count (step S913) and the signal processing unit 250 estimates the count value at the end of the exposure (step S914).

On the other hand, in a case where the count value CNT is less than the upper limit value L1 (step S912: No), the photon counter 274 determines whether or not the time is the exposure end time (step S915). In the case where the time is before the exposure end time (step S915: No), the photon counter 274 repeatedly executes step S911 and subsequent steps.

In the case where the time is the exposure end time (step S915: Yes) or after step S914, the pixel circuit 300 terminates the count processing.

As described above, according to the first embodiment of the present technology, the count control unit 275 stops the count and the signal processing unit 250 estimates the exposure amount when the count value has reached the upper limit value. Therefore, the power consumption can be reduced as compared with the case where the count is not stopped during the exposure period.

[Modification]

In the above-described second embodiment, the resistor 226-1 and the photodiode 227 are arranged for each pixel in the light receiving chip 201. However, there is a problem that the circuit scale of the light receiving chip 201 becomes larger as the number of pixels increases. The solid-state image sensor 200 according to a modification of the second embodiment is different from that of the second embodiment in that only the photodiode 227 is arranged in the light receiving chip 201.

Figure 23:
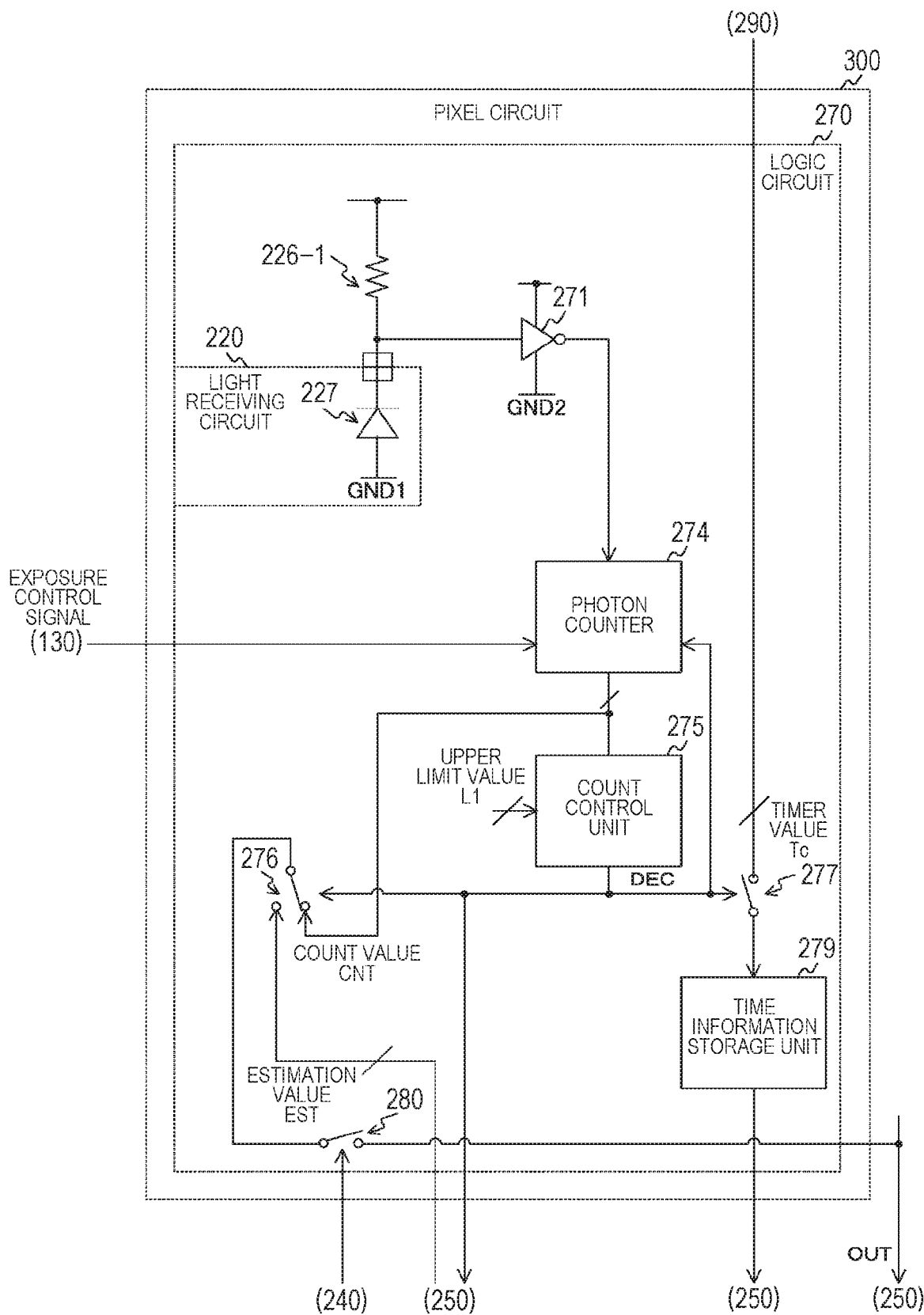
FIG. 23 is a circuit diagram illustrating a configuration example of a pixel circuit according to a modification of the second embodiment of the present technology.

FIG. 23 is a circuit diagram illustrating a configuration example of the pixel circuit 300 according to the modification of the second embodiment of the present technology. The pixel circuit 300 according to the modification of the second embodiment is different from that of the second embodiment in that only the photodiode 227 is arranged in the light receiving circuit 220 on the light receiving chip 201 side. The circuits and elements other than the photodiode 227 are arranged on the logic chip 202 side.

As described above, according to the modification of the second embodiment of the present technology, since only the photodiode 227 is arranged on the light receiving chip 201, the circuit scale of the light receiving chip 201 can be reduced as compared with the case where both the resistor 226-1 and the photodiode 227 are arranged in the light receiving chip 201.

3. Third Embodiment

In the above-described second embodiment, the same power supply potential has been supplied to all the pixels, and further reduction of the power consumption has been difficult. For example, the power consumption can be reduced by decreasing the power supply potential of all the pixels but sensitivity of all the pixels is decreased due to the decrease in the power supply potential, and especially, brightness may become insufficient in a pixel on which light with low illuminance is incident. A solid-state image sensor 200 according to a third embodiment differs from that of the second embodiment in controlling respective power supply potentials of pixels according to illuminance.

Figure 24:
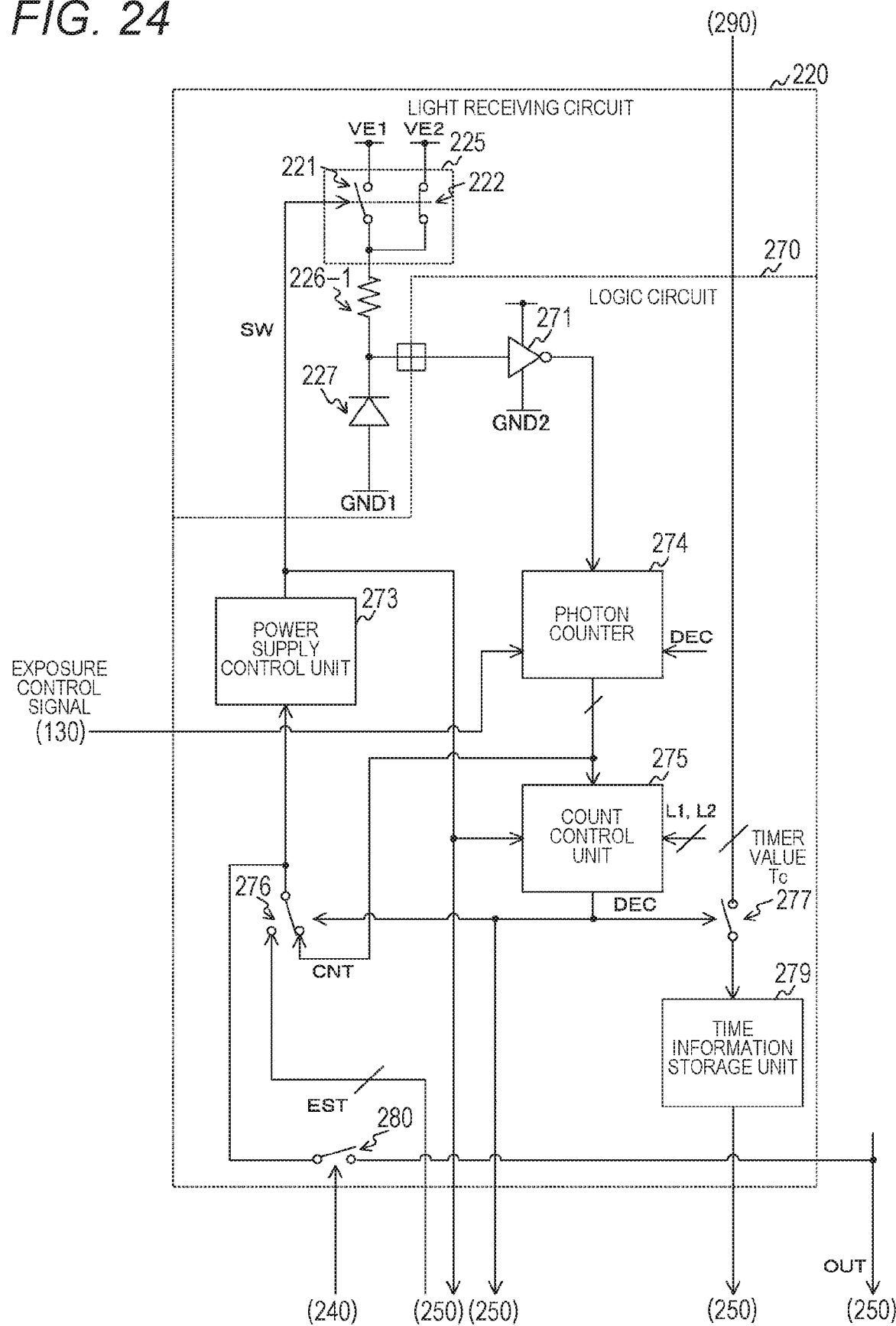
FIG. 24 is a circuit diagram illustrating a configuration example of a pixel circuit according to a third embodiment of the present technology.

FIG. 24 is a circuit diagram illustrating a configuration example of a pixel circuit 300 according to the third embodiment of the present technology. The pixel circuit 300 according to the second embodiment differs from that of the second embodiment in further including switches 221 and 222 and a power supply control unit 273.

The switch 221 opens and closes a path between a terminal of a potential VE1 and a resistor 226-1 according to a switching signal SW. The switch 222 opens and closes a path between a terminal of a potential VE2 and the resistor 226-1 according to the switching signal SW. For example, the potential VE1 is set to a value higher than the potential VE2. Furthermore, the switching signal SW is a signal for giving an instruction for switching of the power supply potential to one of the potentials VE1 and VE2.

A circuit including the switches 221 and 222 functions as a multiplexer 225 that selects one of the potentials VE1 and VE2 according to the switching signal SW. The selected potential is supplied as a power supply potential.

The power supply control unit 273 controls the power supply potential to a lower value as an output value OUT from a switch 276 is larger (that is, illuminance is higher). The power supply control unit 273 compares, for example, the output value OUT with a predetermined threshold Th1, and supplies the switching signal SW giving an instruction on the lower potential VE2 in the case where the output value OUT is larger than the threshold Th1 (that is, the illuminance is high). On the other hand, the power supply control unit 273 supplies the switching signal SW giving an instruction on the higher potential VE1 in the case where the output value OUT is equal to or smaller than the threshold Th1 (that is, the illuminance is low). The switching signal SW is also supplied to a count control unit 275 and a signal processing unit 250 in addition to the multiplexer 225.

Furthermore, the count control unit 275 of the second embodiment selects one of L1 and L2 that are different numerical values from each other as an upper limit value according to the potential indicated by the switching signal SW. L2 is set to a value smaller than L1. For example, in a case where the switching signal SW gives an instruction on the higher potential VE1, the larger upper limit value L1 is selected. On the other hand, in a case where the switching signal SW gives an instruction on the lower potential VE2, the lower upper limit value L2 is selected.

In general, sensitivity of a pixel becomes higher, and a ratio of the number of pulses to the number of incident photons becomes higher, as the power supply potential is higher. Thereby, a rising speed of a count value CNT becomes fast, and an error of an estimation value EST becomes large. Therefore, to reduce the error, a value larger than L2 is set as the upper limit value L1 corresponding to the higher potential.

Furthermore, the signal processing unit 250 also selects one of L1 and L2 as an upper limit value according to the potential indicated by the switching signal SW, similarly to the count control unit 275.

FIG. 25 is a diagram illustrating an example of an operation of the power supply control unit 273 according to the third embodiment of the present technology. The power supply control unit 273 compares the count value CNT with the threshold Th1. In the case where the count value CNT is equal to or smaller than the threshold Th1 (that is, the illuminance is low), the power supply control unit 273 sets the switching signal SW to the low level and causes the multiplexer 225 to select the higher potential VE1.

FIG. 26 is a diagram illustrating an example of an operation of the count control unit 275 according to the third embodiment of the present technology. In a case where the switching signal SW is "0" (that is, the higher potential VE1 has been selected), the count control unit 275 selects the upper limit value L1. Then, in a case where the count value CNT is less than the upper limit value L1, the count control unit 275 outputs a determination result DEC of "0", and in a case where the count value CNT is the upper limit value L1, the count control unit 275 outputs the determination result DEC of "1".

Meanwhile, in a case where the switching signal SW is "1" (that is, the lower potential VE2 has been selected), the count control unit 275 selects the upper limit value L2. Then, in a case where the count value CNT is less than the upper limit value L2, the count control unit 275 outputs the determination result DEC of "0", and in a case where the count value CNT is the upper limit value L2, the count control unit 275 outputs the determination result DEC of "1".

FIG. 27 is a diagram illustrating an example of an operation of the signal processing unit 250 according to the third embodiment of the present technology. In the case where the determination result DEC is "0" (that is, the count value CNT is less than the upper limit value L1), the signal processing unit 250 stops calculation of the estimation value without executing the calculation. Meanwhile, in the case where the determination result DEC is "1" (that is, the count value CNT is the upper limit value L1), the signal processing unit 250 calculates the estimation value EST. In the case where the switching signal SW is "0" (that is, the higher potential VE1 has been selected), the signal processing unit 250 selects the upper limit value L1 and obtains the estimation value EST according to the expression 1.

Meanwhile, in the case where the switching signal SW is "1" (that is, the lower potential VE2 has been selected), the signal processing unit 250 selects the upper limit value L2 and obtains the estimation value EST according to the following expression.

$EST = L2 \times (Te/Tc)$   Expression 2

FIG. 26 is a diagram illustrating an example of the power supply potential for each pixel in each of the second and third embodiments of the present technology. a in FIG. 28 is a diagram illustrating an example of the power supply potential for each pixel in the second embodiment of the present technology, and b in FIG. 28 is a diagram illustrating an example of the power supply potential for each pixel in the first embodiment in which the constant power supply potential is supplied to all of pixels.

For example, it is assumed that the higher potential VE1 is set to 5 volts (V), and the lower potential VE2 is set to 1 volt (V). As illustrated in a in FIG. 19, in the solid-state image sensor 200, 1 volt is supplied to a pixel on which high illuminance light is incident, and 5 volts is supplied to a pixel on which low illuminance light is incident. Meanwhile, as illustrated in b in FIG. 28, 5 volts is supplied to all the pixels in the first embodiment.

Here, power consumption P of the pixel circuit 300 is expressed by the following expression, for example:

$P = C \times VE \times dV$

In the above expression, C represents a cathode capacitance, and the unit is, for example, Farad (F). VE represents the power supply potential, and dV is a potential difference between the anode and the cathode of the photodiode 227.

The potential difference dV is caused to be constant. Furthermore, since the cathode capacitance C is constant, the power consumption of the pixel can be reduced by lowering the power supply potential of the pixel circuit 300 according to the above expression. If the power supply potentials of 30% of all the pixels are decreased to 1 volt (V), the ratio of the power consumption to a case where the power supply potentials of all the pixels are set to 5 volts is expressed by the following expression.

$\frac{1}{5} \times 0.3 = 0.24$

That is, when the power consumption of the case where the power supply potentials of all the pixels are set to 5 volts (V) is 100 percent (%), and the power supply potentials of 30% of all the pixels are set to 1 volt (V), the power consumption decreases to 24 percent (%). In a case of imaging an image in which pixels on which high illuminance light is incident and pixels on which low illuminance light is incident are mixed as described above, the power supply potentials of the latter pixels are decreased, whereby the power consumption of the solid-state image sensor 200 can be reduced, as compared with the case of supplying the same potential to all of pixels.

Figure 29:
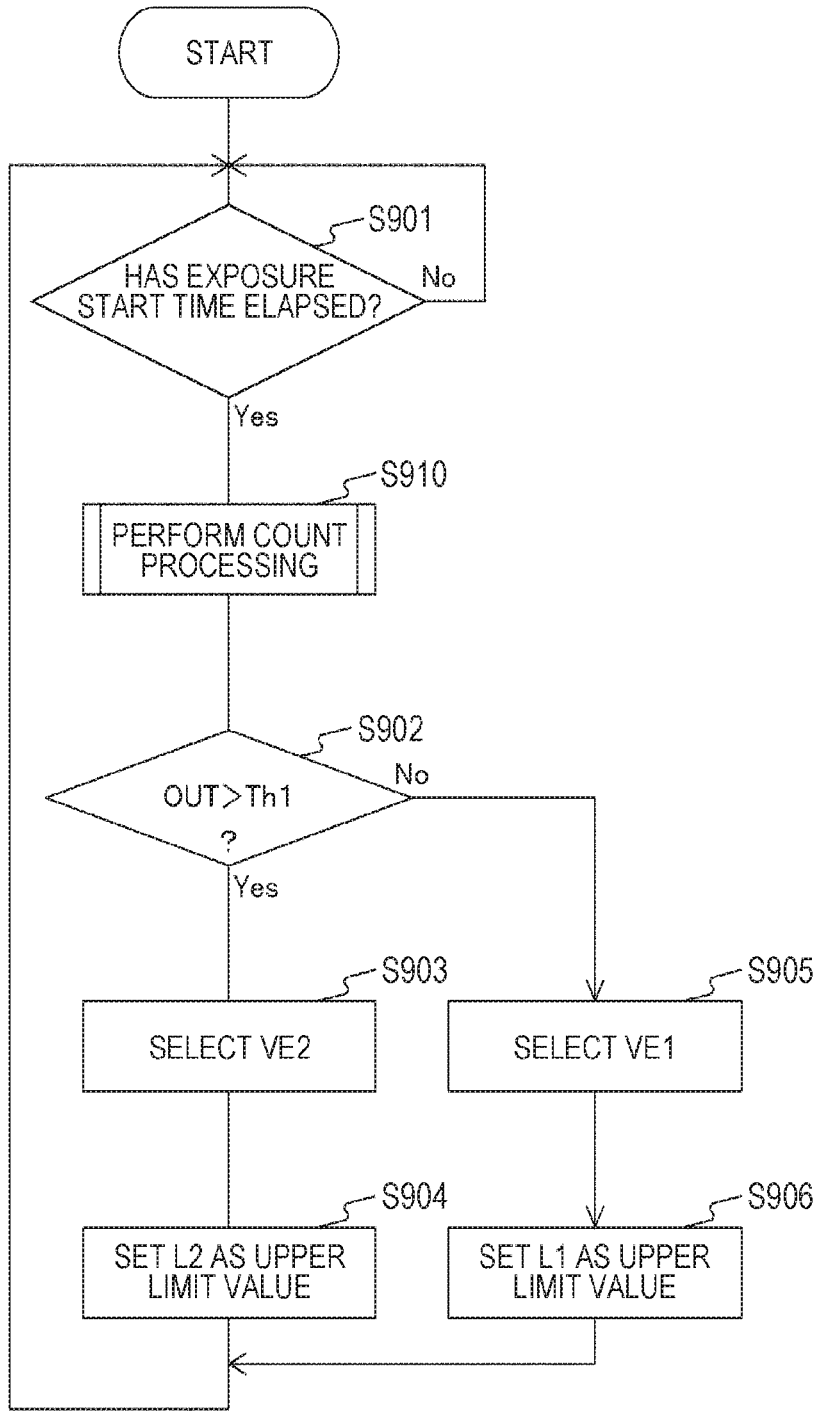
FIG. 29 is a flowchart illustrating an example of an operation of the pixel circuit according to the third embodiment of the present technology.

FIG. 29 is a flowchart illustrating an example of an operation of the pixel circuit 300 according to the third embodiment of the present technology. After counting processing (step S910), the pixel circuit 300 determines whether or not the output value OUT exceeds the threshold Th1 (step S902).

In a case where the output value OUT exceeds the threshold Th1 (step S902: Yes), the pixel circuit 300 selects the potential VE2 (step S903) and sets L2 as the upper limit value (step S904). Meanwhile, in a case where the output value OUT is equal to or smaller than the threshold Th1 (step S902: No), the pixel circuit 300 selects the potential VE1 (step S905) and sets L1 as the upper limit value (step S906).

In a case where the time is before an exposure start time (step S901: No) or after step S904 or S906, the pixel circuit 300 repeats step S901 and subsequent steps.

As described above, according to the second embodiment of the present technology, the power supply control unit 273 in the pixel circuit 300 controls the power supply potential to the lower value as the illuminance is higher, the power consumption of the pixel circuit 300 on which high illuminance light is incident can be reduced.

[Modification]

In the above-described third embodiment, the power supply control unit 273 has controlled the power supply potential to either the potential VE1 or VE2 according to the illuminance. However, there are some cases where the potential VE1 is too high or the potential VE2 is too low. Therefore, it is desirable to more finely control the power supply potential. The pixel circuit 300 according to a modification of the third embodiment is different from that of the third embodiment in controlling the power supply potential in three stages according to illuminance.

Figure 30:
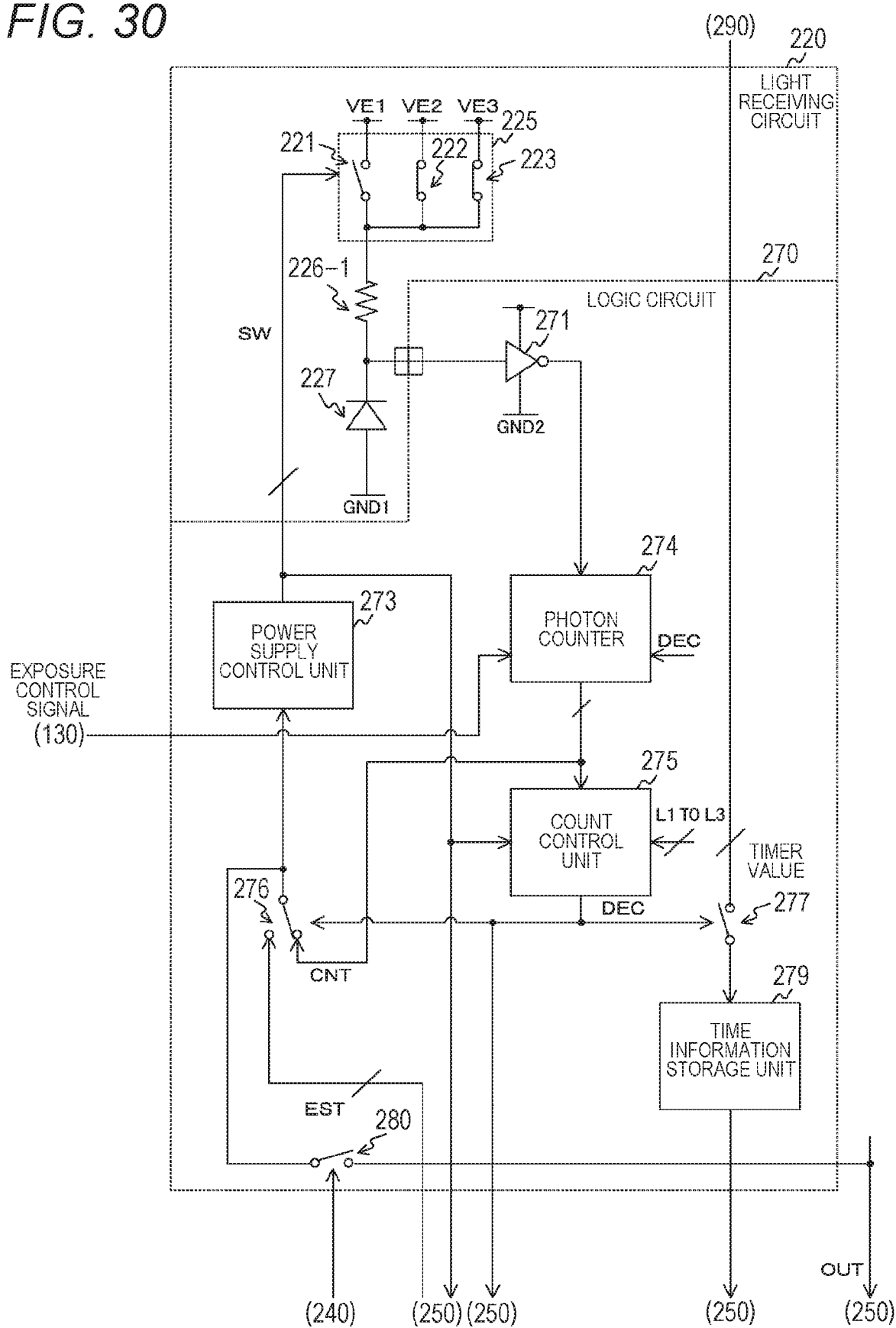
FIG. 30 is a circuit diagram illustrating a configuration example of a pixel circuit according to a modification of the third embodiment of the present technology.

FIG. 30 is a circuit diagram illustrating a configuration example of the pixel circuit 300 according to the modification of the third embodiment of the present technology. The pixel circuit 300 according to the modification of the third embodiment is different from the pixel circuit 300 of the third embodiment in that the multiplexer 225 further includes a switch 223.

The switch 223 opens and closes a path between a terminal of a potential VE3 and one end of the resistor 226-1 according to the switching signal SW. A value lower than the potential VE2 is set as the potential VE3.

Furthermore, the power supply control unit 273 according to the modification of the third embodiment compares the count value CNT with two thresholds and supplies any one of the potentials VE1 to VE3 to the multiplexer 225 on the basis of a result of the comparison.

FIG. 31 is a diagram illustrating an example of an operation of the power supply control unit 273 according to the modification of the third embodiment of the present technology. In the case where the count value CNT is equal to or smaller than the threshold Th1 (that is, the illuminance is low), the power supply control unit 273 sets the switching signal SW to "0" to select the highest potential VE1.

Furthermore, in a case where the count value CNT is larger than the threshold Th1 and is equal to or smaller than the threshold Th2 (that is, the illuminance is in an intermediate level), the power supply control unit 273 sets the switching signal SW to "1" to select the intermediate potential VE2. Here, the threshold Th2 is a value larger than the threshold Th1.

Furthermore, in a case where the count value CNT is larger than the threshold Th2 (that is, the illuminance is high), the power supply control unit 273 sets the switching signal SW to "2" to select the lowest potential VE3.

Note that the power supply control unit 273 controls the power supply potential in three stages by comparing the count value CNT with the two threshold values. However, the power supply control unit 273 can compare the count value CNT with N (N is an integer of 3 or larger) thresholds and control the power supply potential in (N+1) or more stages.

FIG. 32 is a diagram illustrating an example of an operation of the count control unit 275 according to the modification of the third embodiment of the present technology. In the case where the switching signal SW is "0" (that is, the potential VE1 has been selected), the count control unit 275 selects the upper limit value L1. In the case where the switching signal SW is "1" (that is, the potential VE2 has been selected), the count control unit 275 selects the upper limit value L2. Furthermore, in the case where the switching signal SW is "2" (that is, the potential VE3 has been selected), the count control unit 275 selects an upper limit value L3. The upper limit value L3 is set to a value smaller than the upper limit values L1 and L2. Thus, a smaller upper limit value is set as the power supply potential is lower.

FIG. 33 is a diagram illustrating an example of an operation of the signal processing unit 250 according to the modification of the third embodiment of the present technology. In the case where the determination result DEC is "0" (that is, the count value CNT is less than the upper limit value L1), the signal processing unit 250 stops calculation of the estimation value without executing the calculation. Meanwhile, in the case where the determination result DEC is "1" (that is, the count value CNT is the upper limit value L1), the signal processing unit 250 calculates the estimation value EST. In the case where the switching signal SW is "0" (that is, the potential VE1 has been selected), the signal processing unit 250 selects the upper limit value L1 and obtains the estimation value EST according to the expression 1. In the case where the switching signal SW is "1" (that is, the potential VE2 has been selected), the signal processing unit 250 selects the upper limit value L2 and obtains the estimation value EST according to the expression 2.

In the case where the switching signal SW is "2" (that is, the potential VE3 has been selected), the signal processing unit 250 selects the upper limit value L3 and obtains the estimation value EST according to the following expression.

$$EST = L3 \times (Te/Tc)$$

As described above, in the modification of the third embodiment of the present technology, the power supply control unit 273 controls the power supply potential to any one of the potentials VE1 to VE3 according to the illuminance, thereby controlling the power supply potential to a more appropriate value than the case of controlling the power supply potential to either the potential VE1 or VE2.

4. Application Examples to Moving Bodies

The technology according to the present disclosure (present technology) can be applied to various products. For example, the technology according to the present disclosure may be realized as a device mounted on any type of moving bodies including an automobile, an electric automobile, a hybrid electric automobile, a motorcycle, a bicycle, a personal mobility, an airplane, a drone, a ship, a robot, and the like.

FIG. 34 is a block diagram illustrating a schematic configuration example of a vehicle control system as an example of a moving body control system to which the technology according to the present disclosure is applicable.

A vehicle control system 12000 includes a plurality of electronic control units connected through a communication network 12001. In the example illustrated in FIG. 34, the vehicle control system 12000 includes a drive system control unit 12010, a body system control unit 12020, a vehicle exterior information detection unit 12030, a vehicle interior information detection unit 12040, and an integrated control unit 12050. Furthermore, as functional configurations of the integrated control unit 12050, a microcomputer 12051, a sound image output unit 12052, and an in-vehicle network interface (I/F) 12053 are illustrated.

The drive system control unit 12010 controls operations of devices regarding a drive system of a vehicle according to various programs. For example, the drive system control unit 12010 functions as a control device of a drive force generation device for generating drive force of a vehicle, such as an internal combustion engine or a drive motor, a drive force transmission mechanism for transmitting drive force to wheels, a steering mechanism that adjusts a steering angle of a vehicle, a braking device that generates braking force of a vehicle, and the like.

The body system control unit 12020 controls operations of devices equipped in a vehicle body according to various programs. For example, the body system control unit 12020 functions as a control device of a keyless entry system, a smart key system, an automatic window device, and various lamps such as head lamps, back lamps, brake lamps, turn signals, and fog lamps. In this case, radio waves transmitted from a mobile device substituted for a key or signals of various switches can be input to the body system control unit 12020. The body system control unit 12020 receives an input of the radio waves or the signals, and controls a door lock device, the automatic window device, the lamps, and the like.

The vehicle exterior information detection unit 12030 detects information outside the vehicle that mounts the vehicle control system 12000. For example, an imaging unit 12031 is connected to the vehicle exterior information detection unit 12030. The vehicle exterior information detection unit 12030 causes the imaging unit 12031 to capture an image outside the vehicle, and receives the captured image. The vehicle exterior information detection unit 12030 may perform object detection processing or distance detection processing of persons, vehicles, obstacles, signs, letters on a road surface, or the like on the basis of the received image.

The imaging unit 12031 is an optical sensor that receives light and outputs an electrical signal according to a light reception amount of the light. The imaging unit 12031 can output the electrical signal as an image and can output the electrical signal as information of distance measurement. Furthermore, the light received by the imaging unit 12031 may be visible light or may be non-visible light such as infrared light.

The vehicle interior information detection unit 12040 detects information inside the vehicle. A driver state detection unit 12041 that detects a state of a driver is connected to the vehicle interior information detection unit 12040, for example. The driver state detection unit 12041 includes a camera that captures the driver, for example, and the vehicle interior information detection unit 12040 may calculate the degree of fatigue or the degree of concentration of the driver, or may determine whether or not the driver falls asleep at the wheel on the basis of the detection information input from the driver state detection unit 12041.

The microcomputer 12051 calculates a control target value of the drive force generation device, the steering mechanism, or the braking device on the basis of the information outside and inside the vehicle acquired in the vehicle exterior information detection unit 12030 or the vehicle interior information detection unit 12040, and can output a control command to the drive system control unit 12010. For example, the microcomputer 12051 can perform cooperative control for the purpose of realization of an advanced driver assistance system (ADAS) function including collision avoidance or shock mitigation of the vehicle, following travel based on a vehicular gap, vehicle speed maintaining travel, collision warning of the vehicle, lane out warning of the vehicle, and the like.

Furthermore, the microcomputer 12051 controls the drive force generation device, the steering mechanism, the braking device, or the like on the basis of the information around the vehicle acquired in the vehicle exterior information detection unit 12030 or the vehicle interior information detection unit 12040 to perform cooperative control for the purpose of automatic driving of autonomous travel without depending on an operation of the driver, and the like.

Furthermore, the microcomputer 12051 can output a control command to the body system control unit 12020 on the basis of the information outside the vehicle acquired in the vehicle exterior information detection unit 12030. For example, the microcomputer 12051 can perform cooperative control for the purpose of achievement of non-glare by controlling the head lamps according to the position of a leading vehicle or an oncoming vehicle detected in the vehicle exterior information detection unit 12030, switching high beam light to low beam light, and the like.

The sound image output unit 12052 transmits an output signal of at least one of a sound or an image to an output device that can visually and aurally notify a passenger of the vehicle or an outside of the vehicle of information. In the example in FIG. 34, as the output device, an audio speaker 12061, a display unit 12062, and an instrument panel 12063 are exemplarily illustrated. The display unit 12062 may include, for example, at least one of an on-board display or a head-up display.

Figure 35:
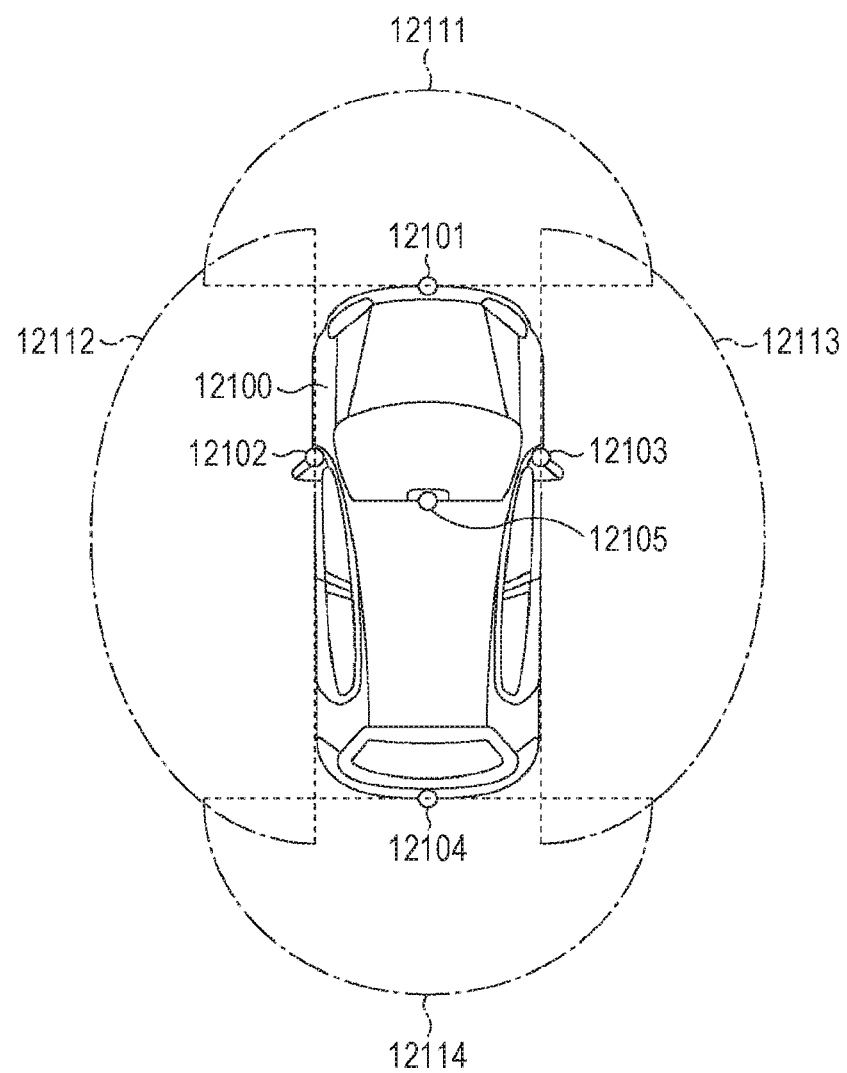
FIG. 35 is an explanatory diagram illustrating an example of installation positions of imaging units.

FIG. 35 is a diagram illustrating an example of an installation position of the imaging unit 12031.

In FIG. 35, imaging units 12101, 12102, 12103, 12104, and 12105 are included as the imaging unit 12031.

The imaging units 12101, 12102, 12103, 12104, and 12105 are provided at positions of a front nose, side mirrors, a rear bumper or a back door, an upper portion of a windshield, and the like in an interior of the vehicle 12100, for example. The imaging unit 12101 provided at the front nose and the imaging unit 12105 provided at an upper portion of the windshield in an interior of the vehicle mainly acquire images in front of the vehicle 12100. The imaging units 12102 and 12103 provided at the side mirrors mainly acquire images on sides of the vehicle 12100. The imaging unit 12104 provided at the rear bumper or the back door mainly acquires an image in back of the vehicle 12100. The imaging unit 12105 provided at the upper portion of the windshield in the interior of the vehicle is mainly used for detecting a preceding vehicle, a pedestrian, an obstacle, a traffic signal, a traffic sign, a lane, or the like.

Note that FIG. 35 illustrates an example of capture ranges of the imaging units 12101 to 12104. An imaging range 12111 indicates the imaging range of the imaging unit 12101 provided at the front nose, imaging ranges 12112 and 12113 respectively indicate the imaging ranges of the imaging units 12102 and 12103 provided at the side mirrors, and an imaging range 12114 indicates the imaging range of the imaging unit 12104 provided at the rear bumper or the back door. For example, a bird's-eye view image of the vehicle 12100 as viewed from above can be obtained by superimposing image data captured in the imaging units 12101 to 12104.

At least one of the imaging units 12101 to 12104 may have a function to acquire distance information. For example, at least one of the imaging units 12101 to 12104 may be a stereo camera including a plurality of image sensors or may be an image sensor having pixels for phase difference detection.

For example, the microcomputer 12051 obtains distances to three-dimensional objects in the imaging ranges 12111 to 12114 and temporal change of the distances (relative speeds to the vehicle 12100) on the basis of the distance information obtained from the imaging units 12101 to 12104, thereby to extract a three-dimensional object closest to the vehicle 12100 on a traveling road and traveling at a predetermined speed (for example, 0 km/h or more) in approximately the same direction as the vehicle 12100 as a leading vehicle. Moreover, the microcomputer 12051 can set an inter-vehicle distance to be secured from the leading vehicle in advance and perform automatic braking control (including following stop control) and automatic acceleration control (including following start control), and the like. In this way, the cooperative control for the purpose of automatic driving of autonomous travel without depending on an operation of the driver, and the like can be performed.

For example, the microcomputer 12051 extracts and classifies three-dimensional object data regarding three-dimensional objects into two-wheeled vehicles, ordinary cars, large vehicles, pedestrians, and other three-dimensional objects such as electric poles, on the basis of the distance information obtained from the imaging units 12101 to 12104, and can use the data for automatic avoidance of obstacles. For example, the microcomputer 12051 discriminates obstacles around the vehicle 12100 into obstacles visually recognizable by the driver of the vehicle 12100 and obstacles visually unrecognizable by the driver. The microcomputer 12051 then determines a collision risk indicating a risk of collision with each of the obstacles, and can perform drive assist for collision avoidance by outputting warning to the driver through the audio speaker 12061 or the display unit 12062, and performing forced deceleration or avoidance steering through the drive system control unit 12010, in a case where the collision risk is a set value or more and there is a collision possibility.

At least one of the imaging units 12101 to 12104 may be an infrared camera that detects infrared light. For example, the microcomputer 12051 determines whether or not a pedestrian exists in the captured images of the imaging units 12101 to 12104, thereby to recognize the pedestrian. Such recognition of a pedestrian is performed by a process of extracting characteristic points in the captured images of the imaging units 12101 to 12104, as the infrared camera, for example, and by a process of performing pattern matching processing for the series of characteristic points indicating a contour of an object and determining whether or not the object is a pedestrian. When the microcomputer 12051 determines that a pedestrian exists in the captured images of the imaging units 12101 to 12104 and recognizes the pedestrian, the sound image output unit 12052 causes the display unit 12062 to superimpose and display a square contour line for emphasis on the recognized pedestrian. Furthermore, the sound image output unit 12052 may cause the display unit 12062 to display an icon representing the pedestrian or the like at a desired position.

An example of a vehicle control system to which the technology according to the present disclosure is applicable has been described. The technology according to the present disclosure is applicable to the imaging unit 12031, of the above-described configurations. For example, the imaging device 100 in FIG. 1 can be applied to the imaging unit 12031. By applying the technology according to the present disclosure to the imaging unit 12031, power consumption of the system including the imaging unit 12031 can be reduced.

Note that the above-described embodiments describe an example for embodying the present technology, and the matters in the embodiments and the matters used to specify the invention in the claims have correspondence, respectively. Similarly, the matters used to specify the invention in the claims and the matters in the embodiment of the present technology given the same names have correspondence, respectively. However, the present technology is not limited to the embodiments, and can be embodied by application of various modifications to the embodiments without departing from the gist of the present technology.

Furthermore, the processing procedures described in the above embodiments may be regarded as a method having these series of procedures, and also regarded as a program for causing a computer to execute these series of procedures and as a recording medium for storing the program. As this recording medium, for example, a compact disc (CD), a mini disc (MD), a digital versatile disc (DVD), a memory card, a Blu-ray (registered trademark) disc, or the like can be used.

Note that the effects described in the present specification are merely examples and are not limited, and other effects may be exhibited.

Note that the present technology can also have the following configurations.

(1) A solid-state image sensor including:
a photodiode configured to photoelectrically convert incident light and output a photocurrent;
a resistor configured to drop a potential of one end of the photodiode to a value lower than a power supply potential every time the photocurrent is output;
a measuring unit configured to measure illuminance of the incident light on the basis of a frequency of dropping of the potential of one end; and
a power supply control unit configured to control the power supply potential to a lower value as the measured illuminance is higher.

(2) The solid-state image sensor according to (1), in which
the power supply control unit controls the power supply potential on the basis of a comparison result between the illuminance and a predetermined threshold.

(3) The solid-state image sensor according to (1), in which
the power supply control unit controls the power supply potential on the basis of comparison results between the illuminance and a plurality of thresholds different from one another.

(4) The solid-state image sensor according to any one of (1) to (3), in which
the photodiode, the resistor, the measuring unit, and the power supply control unit are arranged in each of a plurality of pixel circuits arrayed in a two-dimensional lattice manner.

(5) The solid-state image sensor according to any one of (1) to (4), in which
the measuring unit counts a number of times the potential of one end has been dropped within a predetermined exposure period and supplies a count value to the power supply control unit as a measurement value of the illuminance.

(6) The solid-state image sensor according to any one of (1) to (5), further including:
a selection unit configured to select any one of a plurality of potentials different from one another according to a switching signal and supply the selected potential as the power supply potential, in which
the power supply control unit supplies the switching signal to the selection unit.

(7) A solid-state image sensor including:
an imaging lens configured to collect incident light;
a photodiode configured to photoelectrically convert the incident light and output a photocurrent;
a resistor configured to drop a potential of one end of the photodiode to a value lower than a power supply potential every time the photocurrent is output;
a measuring unit configured to measure illuminance of the incident light on the basis of a frequency of dropping of the potential of the one end; and
a power supply control unit configured to control the power supply potential to a lower value as the measured illuminance is higher.

(8) A method of controlling a solid-state image sensor, the method including:
a measuring procedure of measuring illuminance of incident light on the basis of a frequency of dropping of a potential of one end of a photodiode to a lower value than a power supply potential every time a photocurrent obtained by photoelectrically converting the incident light is output from the photodiode; and
a power supply control procedure of controlling the power supply potential to a lower value as the measured illuminance is higher.

(9) A solid-state image sensor including:
a count unit configured to count a number of time a photon has been incident within a predetermined exposure period and output a count value;
a count control unit configured to stop the count unit in a case where the count value has reached a predetermined limit value before the predetermined exposure period elapses; and
an estimation unit configured to estimate a number of incident times of a photon within the predetermined exposure period on the basis of a time to stop the count unit and output the estimated number of incident times as an estimation value.

(10) The solid-state image sensor according to (9), in which
the estimation unit obtains the estimation value from the time to stop the count unit, a length of the predetermined exposure period, and the predetermined limit value.

(11) The solid-state image sensor according to (9) or (10), further including:
a photodiode configured to detect presence or absence of incidence of one photon;
a resistor configured to return a potential of one end of the photodiode to an initial state every time the incidence of one photon is detected;
a switch configured to output the estimation value as an output value in a case where the count value has reached the predetermined limit value and output the count value as the output value in a case where the count value has not reached the predetermined limit value; and
a power supply control unit configured to control the power supply potential according to the output value, in which
the count unit counts a number of times the potential of one end has varied due to the detection of the presence or absence of incidence of one photon, and
the count control unit and the estimation unit control the predetermined limit value according to the power supply potential.

(12) The solid-state image sensor according to (11), in which the photodiode is an avalanche photodiode.

(13) The solid-state image sensor according to (11), in which the power supply control unit controls the power supply potential on the basis of a comparison result between the output value and a predetermined threshold.

(14) The solid-state image sensor according to (11), in which the power supply control unit controls the power supply potential on the basis of comparison results between the output value and a plurality of thresholds different from one another.

(15) The solid-state image sensor according to any one of (11) to (13), in which the photodiode and the resistor are arranged on a light receiving chip, and the count unit, the count control unit, the estimation unit, the switch, and the power supply control unit are arranged on a logic chip stacked on the light receiving chip.

(16) The solid-state image sensor according to any one of (11) to (13), in which the photodiode is arranged on a light receiving chip, and the resistor, the count unit, the count control unit, the estimation unit, the switch, and the power supply control unit are arranged on a logic chip stacked on the light receiving chip.

(17) The solid-state image sensor according to any one of (9) to (16), in which the count unit and the count control unit are arranged in each of a plurality of pixel circuits arrayed in a two-dimensional lattice manner.

(18) An imaging device including:

a count unit configured to count a number of times a photon has been incident within a predetermined exposure period and output a count value;

a count control unit configured to stop the count unit in a case where the count value has reached a predetermined limit value before the predetermined exposure period elapses;

an estimation unit configured to estimate a number of incident times of a photon within the predetermined exposure period on the basis of a time to stop the count unit and output the estimated number of incident times as an estimation value; and a recording unit configured to record image data generated from the estimation value.

(19) A method of controlling a solid-state image sensor including:

a count procedure of counting a number of times a photon has been incident within a predetermined exposure period and output a count value;

a count control procedure of stopping the count unit in a case where the count value has reached a predetermined limit value before the predetermined exposure period elapses; and an estimation procedure of estimating a number of incident times of a photon within the predetermined exposure period on the basis of a time to stop the count unit and outputting the estimated number of incident times as an estimation value.

REFERENCE SIGNS LIST

100 Imaging device
110 Imaging lens
120 Recording unit
130 Imaging control unit
200 Solid-state image sensor
201 Light receiving chip
202 Logic chip
210 Light receiving unit
220 Light receiving circuit
221, 222, 223, 226, 275, 276, 277, 280 Switch
223, 226-1 Resistor
224, 227 Photodiode
225 Multiplexer
230 Vertical control unit
240 Horizontal control unit
250 Signal processing unit
260 Logic array unit
270 Logic circuit
271 Inverter
272 Transistor
273 Power supply control unit
274 Photon counter
275 Count control unit
279 Time information storage unit
290 Clock circuit
300 Pixel circuit
12031 Imaging unit

The invention claimed is:

1. A solid-state image sensor comprising:
a photodiode configured to photoelectrically convert incident light and output a photocurrent;
a resistor configured to drop a potential of one end of the photodiode to a value lower than a power supply potential every time the photocurrent is output;
a photon counter configured to measure illuminance of the incident light on a basis of a frequency of dropping of the potential of one end; and
a power supply controller configured to control the power supply potential to a lower value as the measured illuminance is higher, wherein
the power supply controller controls the power supply potential on a basis of comparison results between the illuminance and a plurality of thresholds different from one another.

2. The solid-state image sensor according to claim 1, wherein
the photodiode, the resistor, the photon counter, and the power supply controller are arranged in each of a plurality of pixel circuits arrayed in a two-dimensional lattice manner.

3. The solid-state image sensor according to claim 1, wherein
the photon counter counts a number of times the potential of one end has been dropped within a predetermined exposure period and supplies a count value to the power supply controller as a measurement value of the illuminance.

4. The solid-state image sensor according to claim 1, further comprising:
a multiplexer configured to select any one of a plurality of potentials different from one another according to a switching signal and supply the selected potential as the power supply potential, wherein
the power supply controller supplies the switching signal to the multiplexer.

5. A solid-state image sensor comprising:
an imaging lens configured to collect incident light;
a photodiode configured to photoelectrically convert the incident light and output a photocurrent;

a resistor configured to drop a potential of one end of the photodiode to a value lower than a power supply potential every time the photocurrent is output;
a photon counter configured to measure illuminance of the incident light on a basis of a frequency of dropping of the potential of a cathode; and
a power supply controller configured to control the power supply potential to a lower value as the measured illuminance is higher, wherein the power supply controller controls the power supply potential on a basis of comparison results between the illuminance and a plurality of thresholds different from one another.

6. A method of controlling a solid-state image sensor, the method comprising:
a measuring procedure of measuring illuminance of incident light on a basis of a frequency of dropping of a potential of one end of a photodiode to a lower value than a power supply potential every time a photocurrent obtained by photoelectrically converting the incident light is output from the photodiode; and
a power supply control procedure of controlling the power supply potential to a lower value as the measured illuminance is higher, on a basis of comparison results between the illuminance and a plurality of thresholds different from one another.

7. A solid-state image sensor comprising:
a photon counter configured to count a number of times a photon has been incident within a predetermined exposure period and output a count value, and count a number of times the potential of one end has varied due to the detection of the presence or absence of incidence of one photon;
a count controller configured to stop the photon counter in a case where the count value has reached a predetermined limit value before the predetermined exposure period elapses;
a signal processor configured to estimate a number of incident times of a photon within the predetermined exposure period on a basis of a time to stop the photon counter and output the estimated number of incident times as an estimation value;
a photodiode configured to detect presence or absence of incidence of one photon;
a resistor configured to return a potential of one end of the photodiode to an initial state every time the incidence of one photon is detected;
a switch configured to output the estimation value as an output value in a case where the count value has reached the predetermined limit value and output the count value as the output value in a case where the count value has not reached the predetermined limit value; and
a power supply controller configured to control the power supply potential according to the output value, wherein the count controller and the signal processor control the predetermined limit value according to the power supply potential.

8. The solid-state image sensor according to claim 7, wherein
the signal processor obtains the estimation value from the time to stop the photon counter, a length of the predetermined exposure period, and the predetermined limit value.

9. The solid-state image sensor according to claim 7, wherein
the photodiode is an avalanche photodiode.

10. Solid-state image sensor according to claim 7, wherein
the power supply controller controls the power supply potential on a basis of a comparison result between the output value and a predetermined threshold.

11. The solid-state image sensor according to claim 7, wherein
the power supply controller controls the power supply potential on a basis of comparison results between the output value and a plurality of thresholds different from one another.

12. The solid-state image sensor according to claim 7, wherein
the photodiode and the resistor are arranged on a light receiving chip, and
the photon counter, the count controller, the signal processor, the switch, and the power supply controller are arranged on a logic chip stacked on the light receiving chip.

13. The solid-state image sensor according to claim 7, wherein
the photodiode is arranged on a light receiving chip, and
the resistor, the photon counter, the count controller, the signal processor, the switch, and the power supply controller are arranged on a logic chip stacked on the light receiving chip.

14. The solid-state image sensor according to claim 7, wherein
the photon counter and the count controller are arranged in each of a plurality of pixel circuits arrayed in a two-dimensional lattice manner.

15. An imaging device comprising:
a photon counter configured to count a number of times a photon has been incident within a predetermined exposure period and output a count value, and count a number of times the potential of one end has varied due to the detection of the presence or absence of incidence of one photon;
a count controller configured to stop the photon counter in a case where the count value has reached a predetermined limit value before the predetermined exposure period elapses;
a signal processor configured to estimate a number of incident times of a photon within the predetermined exposure period on a basis of a time to stop the photon counter and output the estimated number of incident times as an estimation value;
a memory configured to record image data generated from the estimation value;
a photodiode configured to detect presence or absence of incidence of one photon;
a resistor configured to return a potential of one end of the photodiode to an initial state every time the incidence of one photon is detected;
a switch configured to output the estimation value as an output value in a case where the count value has reached the predetermined limit value and output the count value as the output value in a case where the count value has not reached the predetermined limit value; and
a power supply controller configured to control the power supply potential according to the output value, wherein the count controller and the signal processor control the predetermined limit value according to the power supply potential.

16. A method of controlling a solid-state image sensor comprising:

a count procedure of counting a number of times a photon has been incident within a predetermined exposure period and output a count value, and counting a number of times the potential of one end has varied due to the detection of the presence or absence of incidence of one photon;

a count control procedure of stopping the photon counter in a case where the count value has reached a predetermined limit value before the predetermined exposure period elapses;

an estimation procedure of estimating a number of incident times of a photon within the predetermined exposure period on a basis of a time to stop the photon counter and outputting the estimated number of incident times as an estimation value;

a detection procedure of detecting presence or absence of incidence of one photon;

an initialization procedure of to returning a potential of one end of the photodiode to an initial state every time the incidence of one photon is detected;

an output procedure of outputting the estimation value as an output value in a case where the count value has reached the predetermined limit value and output the count value as the output value in a case where the count value has not reached the predetermined limit value;

a power supply control procedure of controlling the power supply potential according to the output value; and a control procedure of controlling the predetermined limit value according to the power supply potential.

* * * * *